United States Patent [19]

Ito et al.

[11] 4,319,188

[45] Mar. 9, 1982

[54] MAGNETIC ROTARY ENCODER FOR DETECTION OF INCREMENTAL ANGULAR DISPLACEMENT

[75] Inventors: Susumu Ito; Morimasa Nagao; Kaoru Toki; Keizo Morita, all of Tokyo, Japan

[73] Assignee: Nippon Electric Co., Ltd., Tokyo, Japan

[21] Appl. No.: 219,759

[22] Filed: Dec. 24, 1980

Related U.S. Application Data

[63] Continuation of Ser. No. 16,701, Feb. 28, 1979, abandoned.

[30] Foreign Application Priority Data

Feb. 28, 1978 [JP] Japan .................................. 53-23118

[51] Int. Cl.$^3$ ............................................... G01P 3/48
[52] U.S. Cl. ..................................... 324/173; 324/208
[58] Field of Search ............... 324/151, 152, 173, 174, 324/208; 340/347 R, 347 P; 310/68 R, 168

[56] References Cited

U.S. PATENT DOCUMENTS 3,993,946 11/1976 Makino ................................ 324/208
4,039,936 8/1977 Jones et al. ......................... 324/208

OTHER PUBLICATIONS

Wills, *Magnetic Tachometer*, IBM Technical Disclosure Bulletin, vol. 16, No. 1, Jun. 1973, p. 260.
Kuijk et al., *The Barber Pole, a Linear Magnetoresistive Head*, IEEE Trans on Magnetics, vol. Mag-11, No. 5, Sep. 1975, pp. 1215-1217.

*Primary Examiner*—Eugene R. LaRoche

*Attorney, Agent, or Firm*—Sughrue, Mion, Zinn, Macpeak & Seas

[57] ABSTRACT

A magnetic rotary encoder for detecting incremental angular displacement, angular velocity and rotating direction using magneto-resistors is disclosed. A drum, disk or cupshaped rotary member is attachable to a rotatable shaft. A magnetic medium is provided on a surface of the rotary member and is divided at a pitch p into a plurality of magnetic sections each of which has a magnetic signal recorded. The magnetic medium produces an alternating magnetic field as the rotary member revolves. Alternatively, a plurality of permanent magnets are provided on the surface of the rotary member to produce the alternating magnetic field of the rotary member revolves. A magnetic field detector includes at least one magneto-resistor having a stripe-like configuration with width D. The magneto-resistor is located in the vicinity of the rotary member so as to be spaced from the magnetic medium or the permanent magnets by equal to or less than p at its nearest portion and by equal to or less than 20p at its furthest portion. The width D is selected so as not to be in excess of 20p but to be equal or less than p .sec $\phi$, where $\phi$ is an angle defined by the nearest surfaces of the magneto-resistor and the magnetic medium or permanent magnets. The magneto-resistor is responsive to the alternating magnetic field to generate an analog signal representative of its electrical resistance change corresponding to the increment of the rotational angle of the rotary member. A rotary condition detector is electrically connected to the magnetic field detector to receive the analog signal and produce signals indicative of the rotating conditions of the rotatable shaft.

54 Claims, 74 Drawing Figures

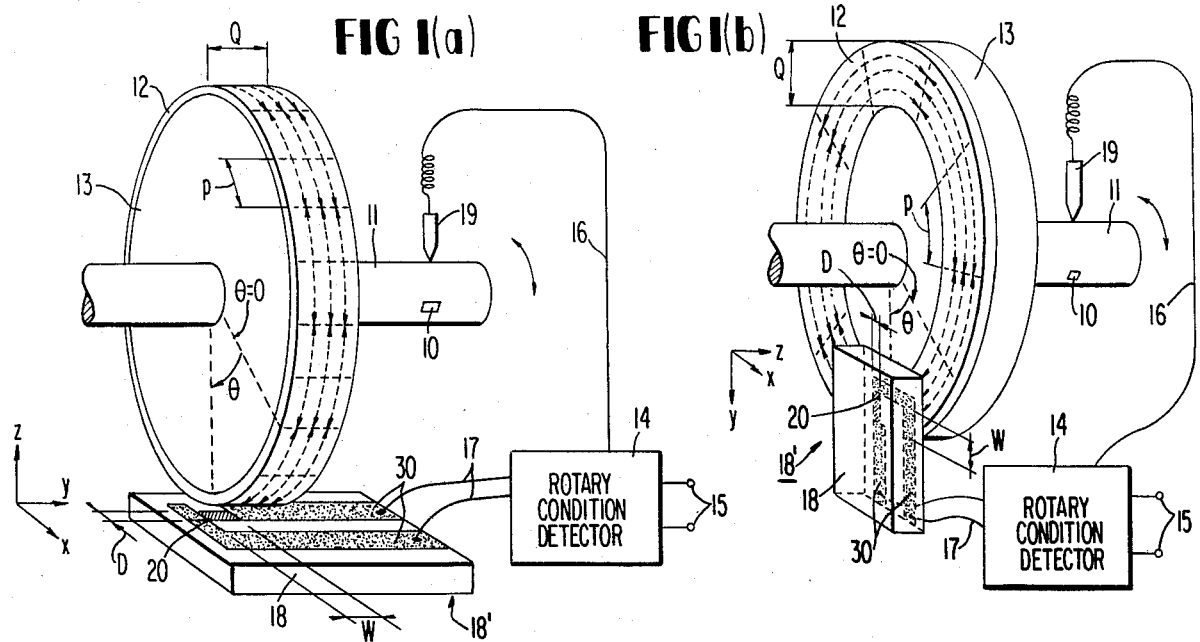
FIG 1(a)
FIG 1(b)
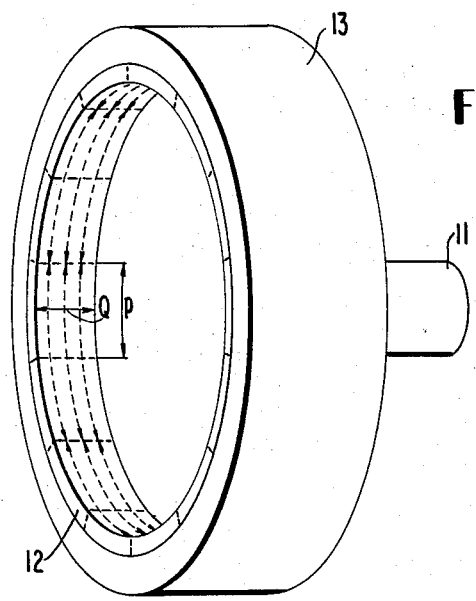
FIG 2(a)
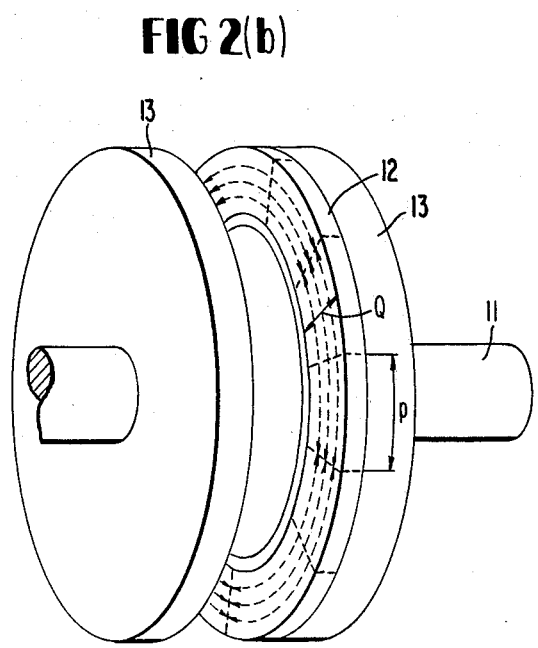
FIG 2(b)

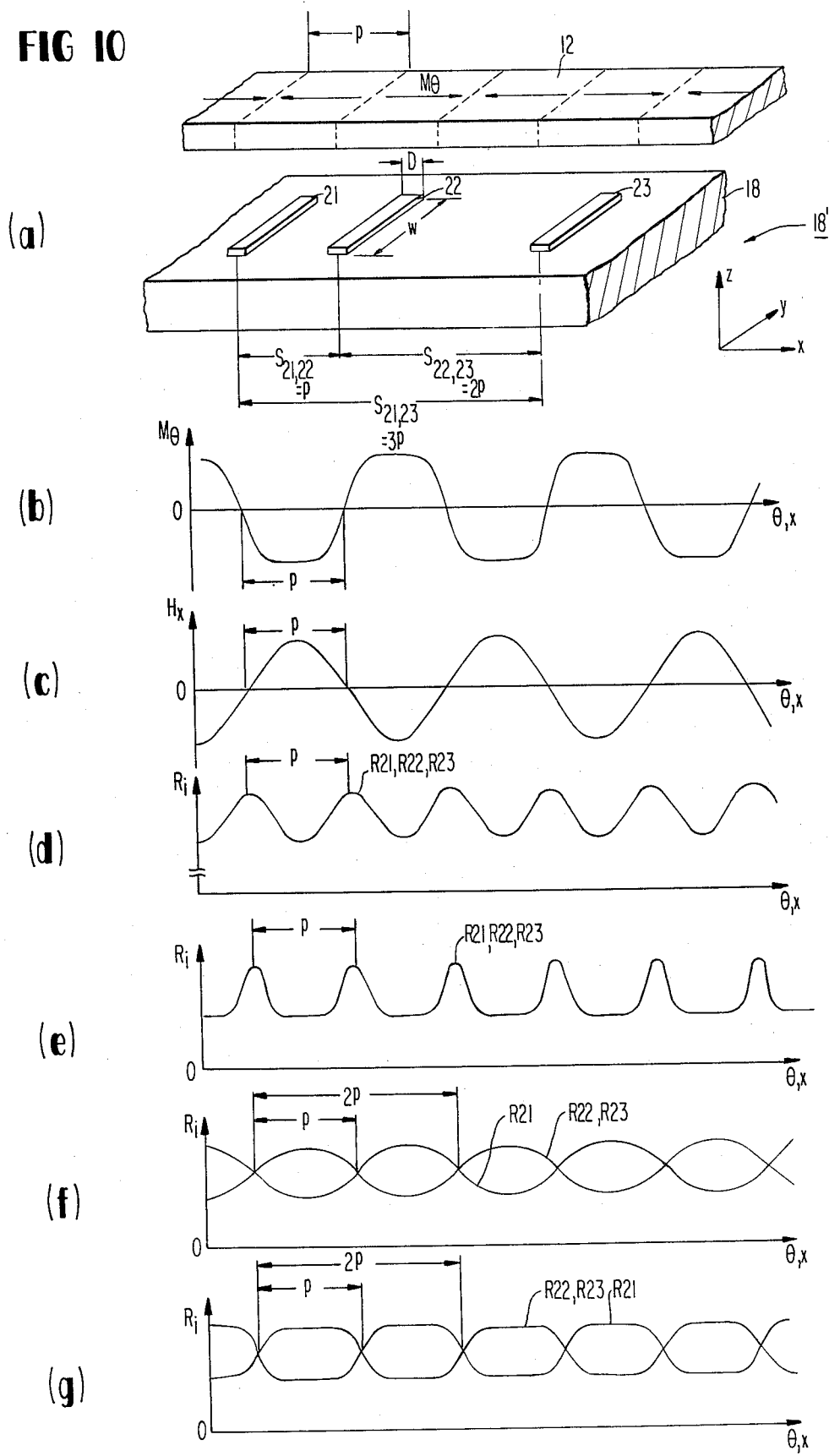

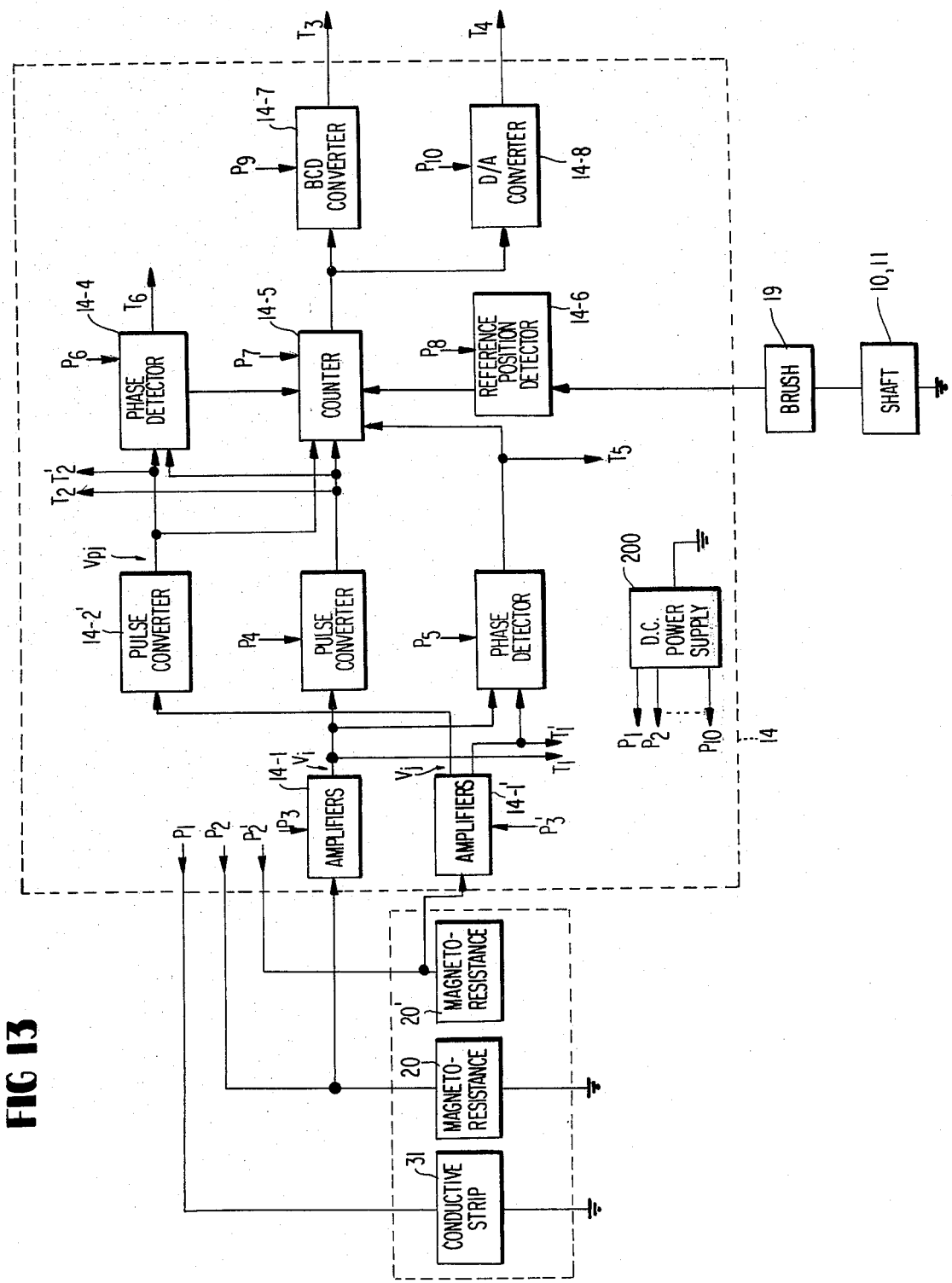

FIG 16
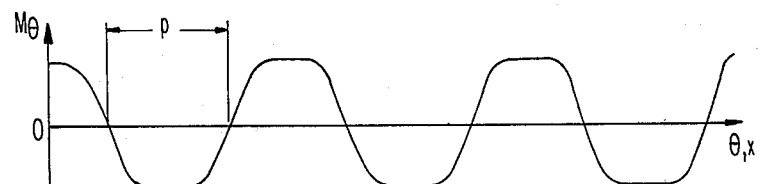
(a)
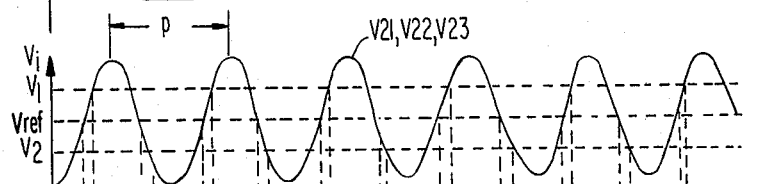
(b)
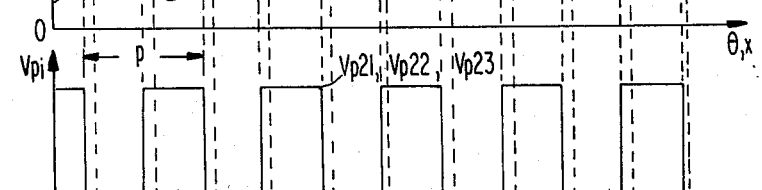
(c)
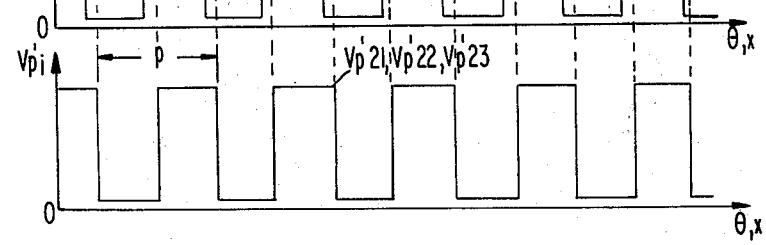
(d)
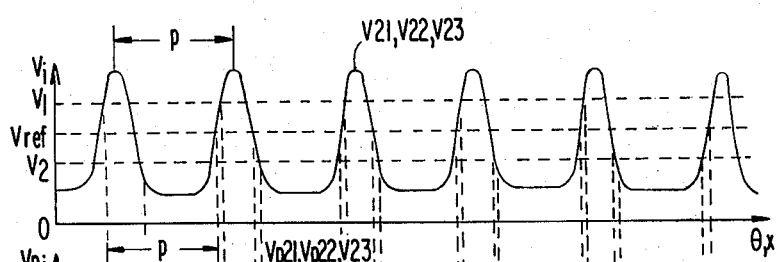
(e)
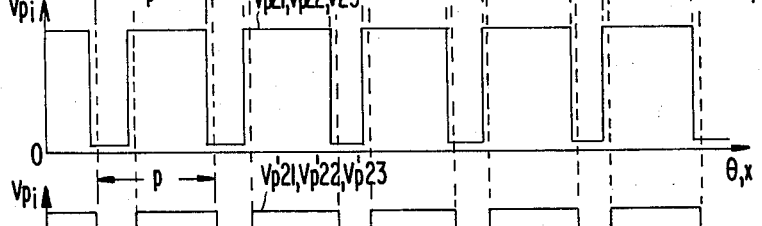
(f)
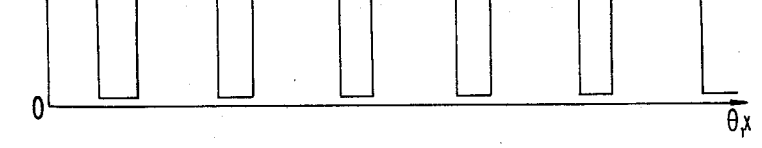
(g)

MAGNETIC ROTARY ENCODER FOR DETECTION OF INCREMENTAL ANGULAR DISPLACEMENT

This is a continuation of application Ser. No. 16,701, filed Feb. 28, 1979, now abandoned.

FIELD OF THE INVENTION

This invention relates to a magnetic rotary encoder or a magnetic tachometer having one or more magneto-resistors, and particularly to a magnetic rotary encoder for detecting incremental angular displacement, angular velocity, and the rotating direction of a rotatable shaft of a motor, a gear, or the like.

BACKGROUND OF THE INVENTION

Accurate and reliable measurement of the angular distance, the angular velocity, and the rotating direction of a rotatable shaft attached to a motor or a gear is frequently needed for various purposes such as the control of precision instruments. To meet such a requirement, several hardware constructions have been proposed resorting to digital control. One example of those constructions is the optical rotary encoder comprising a glass disk with a plurality of photo-slits, and at least one pair of an LED (light emitting diode) and a photo-sensitive diode which are positioned at opposite sides of the glass disk. However, this optical encoder has encountered some problems: (1) it requires a highly accurate exposure as well as a high etching technique to provide the photo-slits on the entire surface of the glass disk without aberration, (2) it is practically very difficult to accurately adjust the center of the photo-slits with that of a bore receiving a rotatable shaft, (3) in order to snugly receive the rotatable shaft, such a bore should be precisely processed and finished, which causes some practical difficulty, (4) as a consequence the encoder becomes costly for achieving initially intended results, and (5) furthermore, the encoder is vulnerable to external shocks.

As another approach to attain the above-mentioned purposes, a magnetic tachometer has been proposed by A. B. Wills in *IBM Technical Disclosure Bulletin*, Volume 16, No. 1 (June issue, 1973), page 260. The tachometer comprises a disk carrying a magnetic medium on one surface near its perimeter, and a magnetic flux transducer. The transducer senses magnetic signals recorded on the magnetic medium to determine the rotational speed of the disk, namely, the rotational speed of the shaft to which the disk is connected. However, the Bulletin does not disclose a magnetic tachometer in a concrete manner but only its possibility.

As still another approach, an example of a transducer apparatus for rotary displacement is described in U.S. Pat. No. 4,039,936. According to this patent, the apparatus comprises two transducers each having a pair of U-shaped magneto-resistors mounted on a permanent magnet. The magnet is supported in a fixed position adjacent a rotatable disk which has teeth and is moved in either direction. Although the transducer is resistive to external shocks is easy manufacture as opposed to the above-mentioned optical rotary encoder, the pitch of the teeth, which determines the accuracy of rotary displacement, cannot be made so small as to precisely measure the rotary displacement.

It is therefore one object of this invention to provide a magnetic encoder for accurately and reliably detecting incremental angular displacement as well as angular velocity with relatively simple construction.

It is another object of this invention to provide a magnetic encoder for accurately and reliably detecting incremental angular displacement, angular velocity, and the rotating direction of a shaft connected to the encoder with relatively simple construction.

SUMMARY OF THE INVENTION

According to this invention, the magnetic rotary encoder comprises, rotary means attachable to a rotatable shaft; a magnetic medium endlessly provided on a surface of said rotary means, being divided at a pitch p, into a plurality of magnetic sections each of which has a magnetic signal recorded, said magnetic medium producing an alternating magnetic field as said rotary means revolves, and the thickness of said magnetic medium being less than p; a magnetic field detector including at least one magneto-resistor having a stripe-like configuration with width D and provided in the vicinity of said rotary means such as to be spaced relative to said magnetic medium by equal to or less than p as its nearest portion and by equal to or less than 20p at its furthest portion, said width D being so selected as not to be in excess of 20p but to be equal to or less than p. sec $\phi$, where $\phi$ is an angle defined by the nearest surfaces of said magneto-resistor and said magnetic medium, and said magnetoresistor responsive to said alternating magnetic field and generating an analog signal representative of its electrical resistance change corresponding to the increment of the rotational angle of said rotary means; and a rotary condition detector electrically connected to said magnetic field detector, receiving said signal and producing signals indicative of the rotating conditions of said rotatable shaft connected to said rotary means.

According to another aspect of this invention, the magnetic rotary encoder comprises: rotary means attachable to a rotatable shaft; a plurality of permanent magnets provided on a surface of said rotary means such as to produce an alternating magnetic field as said rotary means revolves; a magnetic field detector including, at least one magneto-resistor having a stripe-like configuration with width D and provided in the vicinity of said rotary means such as to be spaced relative to said magnetic medium by equal to or less than p at its nearest portion and by equal to or less than 20p at its furthest portion, said width being so selected as not to be in excess of 20p but to be equal to or less than p. sec $\phi$, where $\phi$ is an angle defined by the nearest surfaces of said magneto-resistor and said magnetic medium, and said magneto-resistor responsive to said alternating magnetic field and generating an analog signal representative of its electrical resistance change corresponding to the increment of the rotational angle of said rotary means; and a rotary condition detector electrically connected to said magnetic field detector, receiving said signal and producing signals indicative of the rotating conditions of said rotatable shaft connected to said rotary means.

BRIEF DESCRIPTION OF THE DRAWINGS

These and other objects, features and many of the attendant advantages of this invention will be appreciated more readily as the same becomes better understood by reference to the following detailed description, when taken in connection with the accompanying drawings, wherein like parts in each of the several figures are identified by the same reference numerals, and wherein:

FIG. 1a is a perspective view of a first preferred embodiment of this invention;

FIG. 1b is a perspective view of a modification of the first embodiment of FIG. 1a;

FIGS. 2a and 2b are perspective views of rotary means for use in this invention;

FIG. 5b is a perspective view of a modification of the second embodiment of FIG. 5a;

FIG. 8b is a perspective view of a modification of the third embodiment of FIG. 8a;

FIG. 9b is a perspective view of a modification of the fourth embodiment of FIG. 9a;

FIGS. 10(a) through 10(g), FIGS. 11(a) through 11(g) and FIGS. 12a and 12b are diagrams for describing in detail the third embodiment of this invention;

FIG. 13 illustrates a rotary condition detector in detail;

DETAILED DESCRIPTION OF PREFERRED EMBODIMENTS OF THIS INVENTION

Figure 3A:
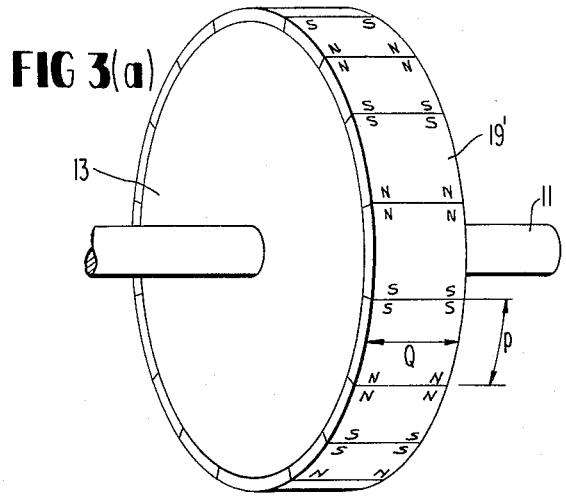
FIGS. 3a through 3f are each a perspective view of another rotary means for use in this invention.

Referring now to FIG. 1a, a drum-type rotary means 13 is fixedly attached to a rotatable shaft or axle 11 which is, although not shown, connected to a motor or gear and driven thereby. The shaft 11 is provided with a reference mark 10 in such a manner that the mark 10 may contact suitable contacting means such as a brush 19 when the shaft 11 rotates. When the reference mark 10 contacts the brush 19, a signal indicative of a reference angular position of the shaft 11 ($\theta = 0$) is applied to a rotary condition detector 14 through a conductive lead 16. A magnetic medium 12 is endlessly provided on the periphery of the rotatable drum 13 and divided into plural magnetic sections each of which has width Q and pitch p, and which is oppositely magnetized with respect to its immediately adjacent magnetic sections as shown by broken lines with arrow heads. A magnetic field detector or a magnetic flux sensitive unit 18' is positioned under the rotatable drum 13 and comprises a suitable base or substrate 18, on the upper surface of which a flux sensitive transducer such as a magneto-resistor (hereinafter, generally referred to MR) 20 and two conductive film strips 30 are provided and electrically connected. The MR 20 produces a signal indicating its resistance change in response to the alternating magnetic flux from the medium 12 when the drum 13 revolves. The rotary condition detector 14 is coupled to the MR 20 through a pair of leads 17 as well as the conductive film strips 30 supplied with the signal from the MR 20 and detecting the rotary conditions of the shaft 11 such as incremental angular distance, velocity, etc.

The rotary encoder of FIG. 1a can be modified as shown in FIG. 1b, wherein the drum type rotary means 13 of FIG. 1a is replaced by a disk labelled by like reference numeral. In this modification, the medium 12 is provided on one side surface of the disk 13, and the magnetic field detector 18' is changed in position so as to face the medium 12. These arrangements of FIGS. 1a and 1b function similarly, so further description of the latter will be omitted.

The pitch p is determined considering the actual detecting accuracy of the magnetic field detector 18' as well as the required accuracy of the rotary conditions of the shaft 11. If the number of the magnetic sections of the medium 12 is required to be N, the pitch p is determined as follows:

$$p = 2R \frac{m}{aN}$$

where

R = an inner radius of the magnetic medium 12;
a = 1 or 2; and
m = 1 or a positive integer more than 1.

Figure 6A:
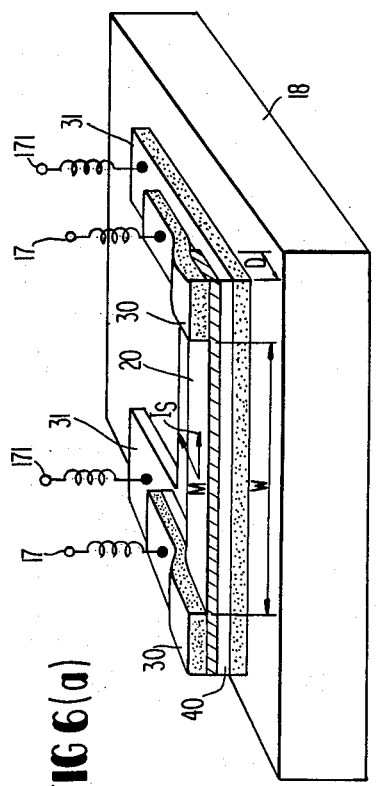
Figure 6B:
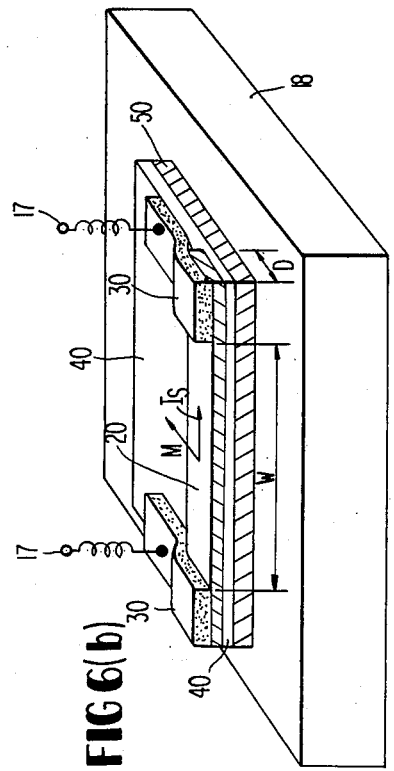
Figure 6C:
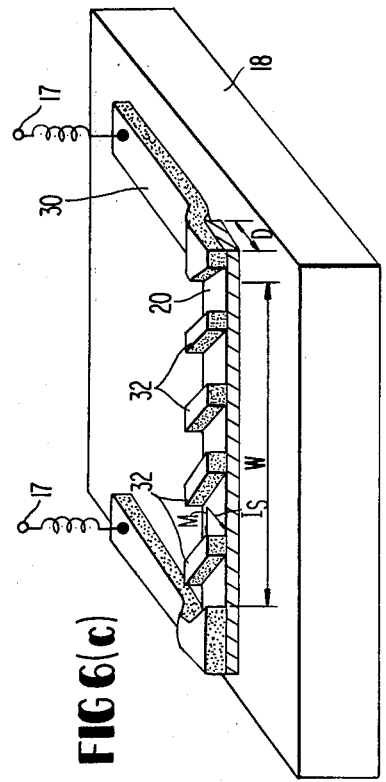
Figure 17:
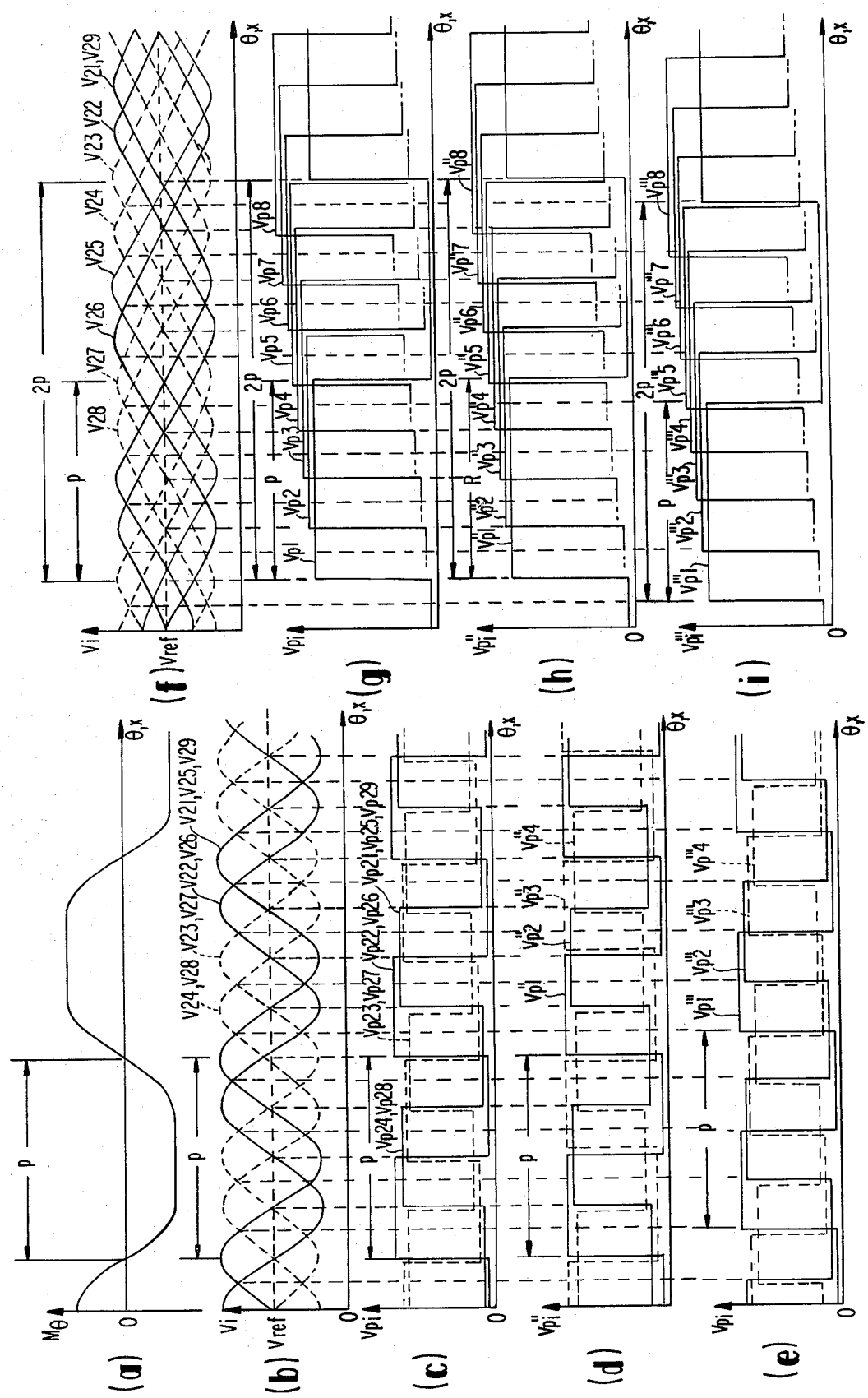

More specifically, the "a" is 2 where either of the arrangements of FIGS. 6a through 6c is applied to the detector 18' and otherwise becomes unity. The "m" is 1 where a single MR is used in FIG. 1a or 1b, and is a positive integer greater than 1 where plural MRs are used. In the latter case, the "m" should be identical to the number of pulse trains having different phases, which occurs while the rotating drum or disk 13 revolves by a distance corresponding to the pitch p. For example, m = 4 when the resistance changes of the MRs are obtained as shown in FIG. 17(c) or 17(g), and m = 8 when the resistance changes of the MRs are as shown in FIG. 17(d), 17(e), 17(h), or 17(i).

The magnetic medium 12 is required to have the following characteristics: (1) the magnetic information or signal should be accurately recorded thereon, and (2) sufficient leakage flux therefrom should reach as great a distance as possible. For this purpose, the medium 12 is preferably made of material capable of having high residual magnetization as well as high coercive force. From the point of view of a reaching range of the leakage flux, the thickness of the medium 12 is desirably large. However, our experiment teaches that the practical thickness of the medium 12 should be less than the pitch p in order to satisfy the conditions: (1) the magnetic signal is accurately recorded on the medium 12, and (2) the MR 20 detects accurately each leakage flux of the magnetic section. Furthermore, the coercive force should be over 100 Oersted for reliably retaining the magnetization on the medium 12.

FIG. 2a is an illustration of another variation of the rotary means 13 of FIG. 1a, wherein it is cup-shaped and the medium 12 is provided on its inner surface, as shown. Still another variation of the rotary means 13 of FIG. 1b is illustrated in FIG. 2b, wherein the rotary means 13 has a bobbin-like shape and the medium 12 is provided on the inner side surface of one flange. In the above both cases, the magnetic field detector 18' should be positioned near the medium 12 in a facing manner, although not shown.

Figure 3B:
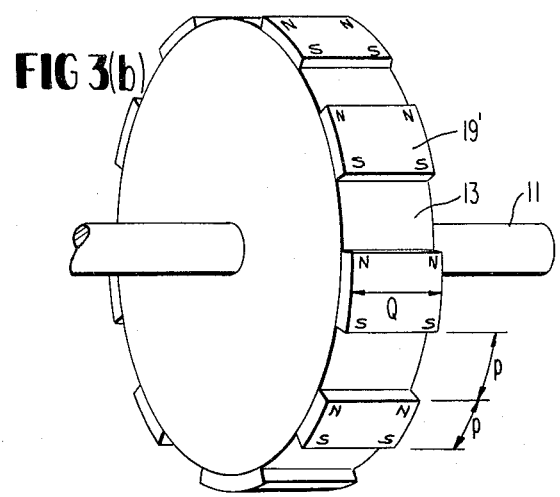
Figure 3C:
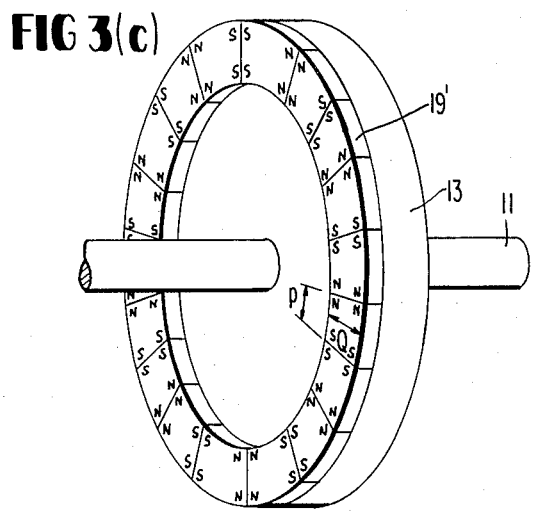
Figure 3D:
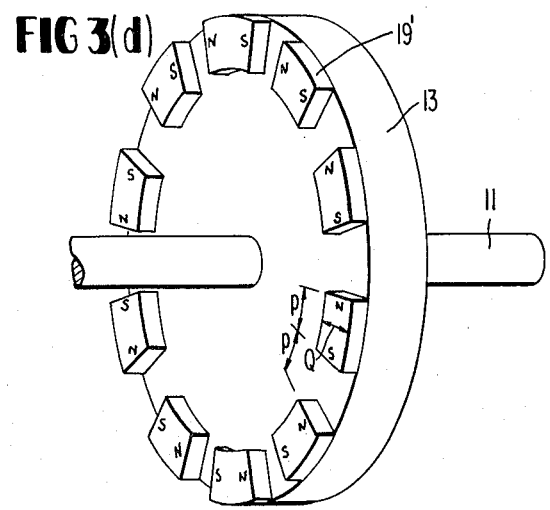
Figure 3E:
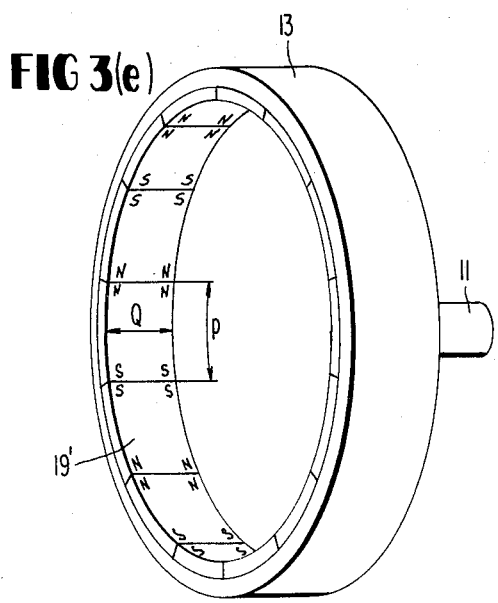
Figure 3F:
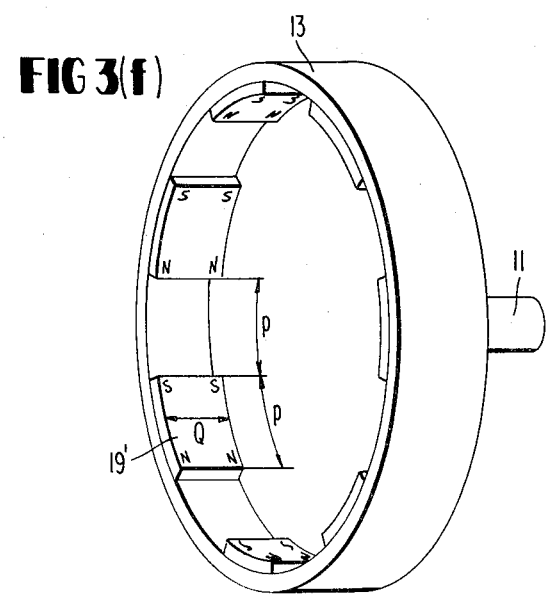

FIGS. 3a through 3f are each a perspective illustration of another variation of the rotary means 13 of FIG. 1a, 1b, 2a, or 2b, wherein the magnetic medium 12 is substituted by a plurality of thin platelike permanent magnets 19 each of which has width Q and length identical to the pitch p. The rotary means 13 of FIGS. 3a, 3c, and 3e correspond to those of FIGS. 1a, 1b, and 2a, respectively, and each of the rotary means 13 of FIGS. 3b, 3d, and 3f is a variation of its preceding one. As is evident from the illustrations of FIGS. 3a through 3f, the permanent magnets 19 of FIGS. 3a, 3c, and 3e are arranged in an abutting manner with the illustrated directions of magnetization. On the other hand, the magnets 19 of FIGS. 3b, 3d, and 3f are so arranged as to be spaced from one another by the pitch p with the shown directions of magnetization. The magnets 19 are fixed to their associated portions by suitable adhesive material such as epoxy resin. Inasmuch as the various types of the rotary means 13 thus far described have the same characteristics, that of FIG. 1a will be referred to hereinafter.

Referring back to FIG. 1a, the MR 20 of the detector 18' is a ferromagnetic thin film, having width D, length w, and thickness ranging from about 100 to about 20,000 Angstrom, and is so arranged as to alternately change the direction of its magnetization M in response to leakage flux from the magnetic medium 12.

The direction of the magnetization M of the MR 20 generally is changed in response to magnetic flux applied parallel to the surface of the MR 20. The MR 20 has electrical resistance which changes as a function of an angle $\phi$ difined by two directions of the magnetization M and a sense current Is. The current Is flows through the MR 20 for sensing the resistance change of the MR 20. The resistance change of the MR 20 as a function of $\phi$ is:

$$R(\phi) = R\phi - \Delta R \sin^2 \phi$$

where
$R_0$ = resistance of the MR 20 when the magnetization M has its direction parallel to that of the sense current Is; and
$\Delta R$ = a constant of resistance of the MR 20.

Figure 4:
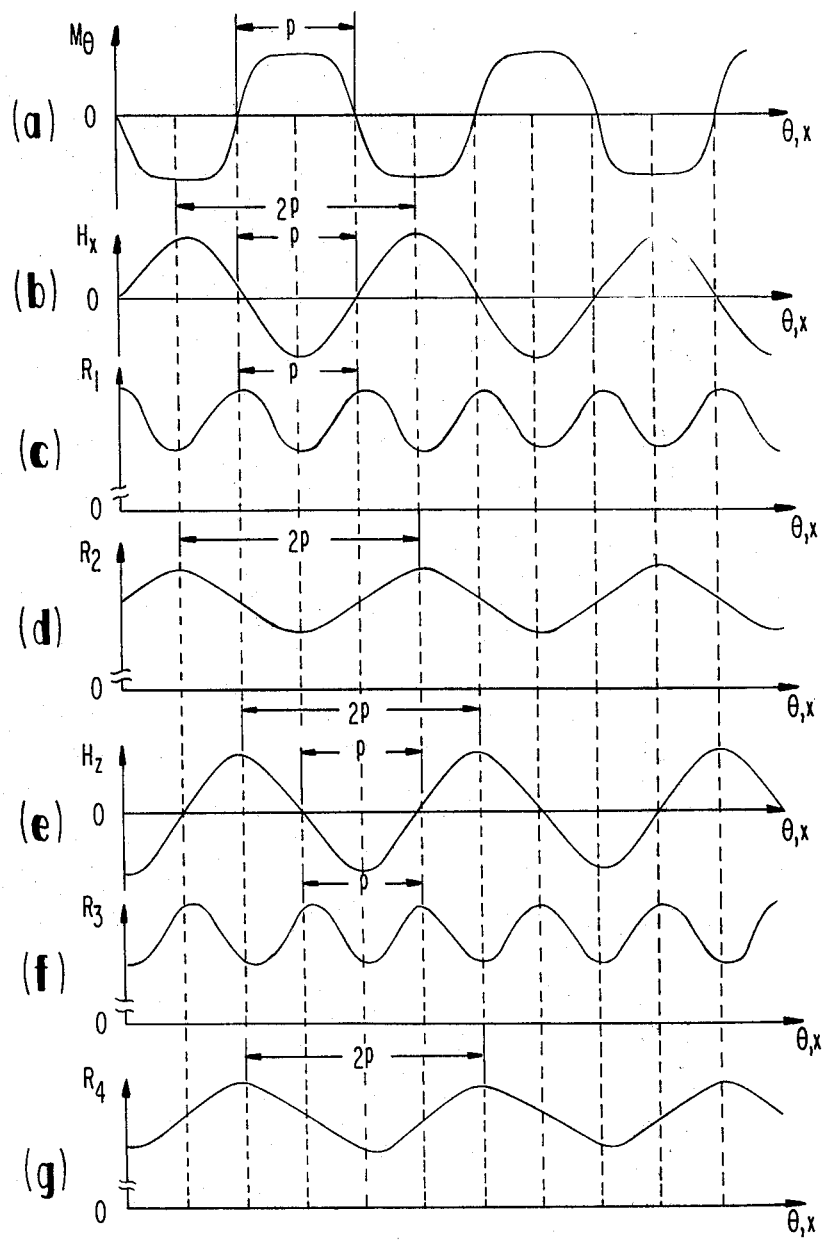
FIGS. 4(a) through 4(g) are curves for describing this invention.

FIG. 4(a) is a curve representing the magnitude of the magnetic signal (M$\theta$) on the medium 12 of FIG. 1a vs. angular displacement $\theta$. With this arrangement of FIG. 1a, only the magnetic field in a direction of the x-axis, i.e., $H_x$, which changes as a function of $\theta$ as shown in FIG. 4(b), serves to change the resistance of the MR 20 having its easy axis along with the y-axis. More specifically, the $H_x$ affects the magnetization M of the MR 20 in such a way as to make it perpendicular to the sense current Is. As a result, the resistance of the MR 20 shows a change as shown by $R_1$ in FIG. 4(c) while the drum 13 rotates. Hereinafter, the term resistance implies electrical resistance unless otherwise stated.

Figure 5A:
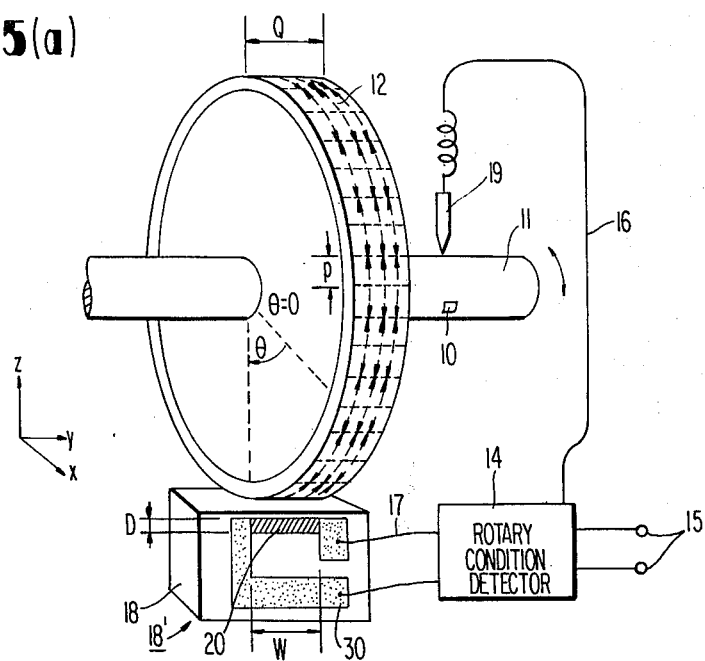
FIG. 5a is a perspective view of a second embodiment of this invention.

FIG. 5a schematically illustrates a second embodiment of this invention, wherein the magnetic field detector 18' is arranged differently as against that of FIG. 1a.

Figure 5B:
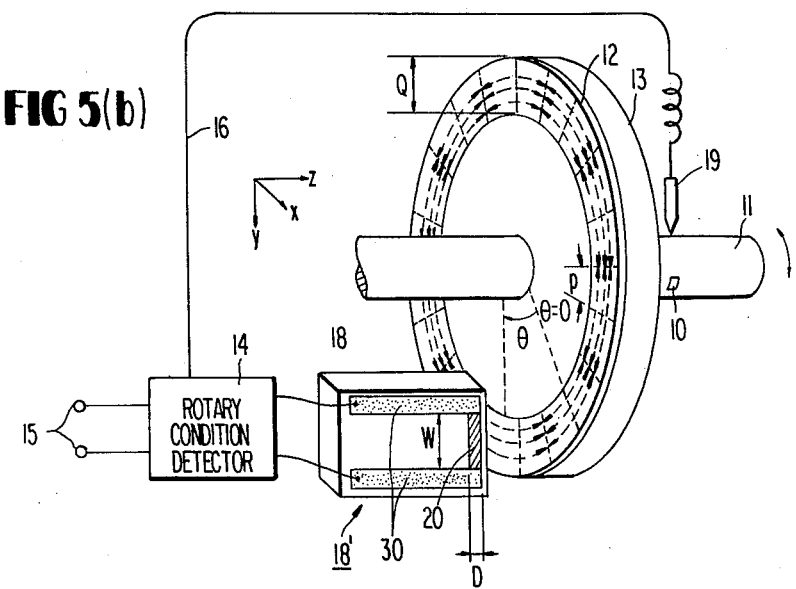

In FIG. 5a, the angle $\phi$ ranges from 90° (degrees) to 90°±45°, whilst in FIG. 1a is ranges from 0° to ±45°. As a result, only the magnetic field parallel to the z-axis, i.e., $H_z$ (FIG. 4(e)) serves to change the resistance of the MR 20. The resistance change is illustrated as $R_3$ in FIG. 4(f) as a function of the angular distance $\theta$. A modification of the FIG. 5a arrangement is illustrated in FIG. 5b, wherein the resistance change of the MR 20 is the same as that in the arrangement of FIG. 5a, so further description will be omitted.

It has been known in the art that when the sense current Is is set to flow through the MR 20 at the angle of 45° relative to the direction of the magnetization M, the following advantages can be obtained: (1) the flux sensitivity of the MR 20 increases, and (2) the resistance of the MR 20 varies similarly as the direction of flux applied to the MR 20 varies. As a consequence, if the above technique is applied to the arrangements of FIGS. 1a to 1b and 5a to 5b, the resistance of the MR 20 varies as indicated by $R_2$ (FIG. 4(c)) and $R_4$ (FIG. 4(g)), respectively. This technique will be referred to in more detail in conjunction with FIGS. 6a through 6c.

In FIG. 6a, a strip of conductor 31 (width D, length w) is provided on the substrate 18 on which an insulating film 40 and the MR 20 are laminated as shown. A current of predetermined value is applied to the MR 20 through a terminal 171 from the rotary detector 14 (not shown). The magnetic field established by the predetermined current causes the magnetization M of the MR 20 to slant by an angle of 45° relative to the sense current Is which flow through the MR 20. In FIG. 6b, the conductor 31 is substituted by a hard magnetic film 50. The magnetic field about the film 50 causes the magnetization M of the MR 20 is slant by the angle of 45° with respect to the sense current Is. Finally, in FIG. 6c, strips of conductors 32 cover the MR 20 such as to make the direction of its longitudinal axis lie at 45° with respect to the easy axis of the MR 20. In the area between the conductor strips, the current flows from one strip to the next in a direction perpendicular to the conductor strips with the result that an angle of 45° with the easy axis is formed. In this case, the magnetization M of the MR 20 is not influenced by the strips. The arrangement of FIG. 6c is disclosed in an article entitled "The Barber Pole, A Linear Magneto-Resistive Head" by K. E. Kuijk et al. published in *IEEE Transactions on Magnetics*, Vol. Mag-11. No. 5, September issue, 1975, pp. 1215–1217.

Figure 7A:
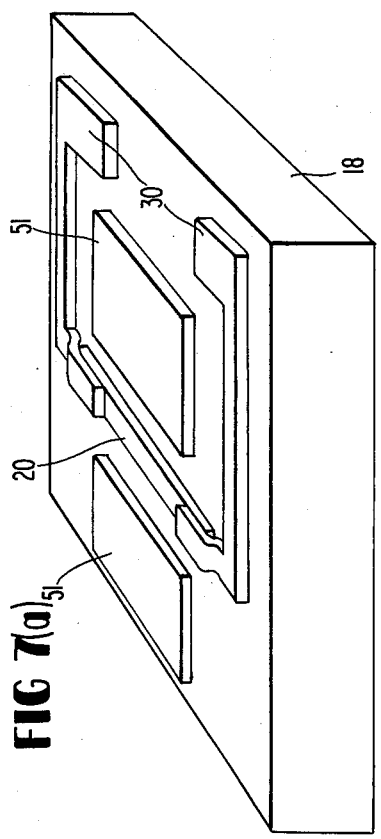
FIGS. 6a through 6c and FIGS. 7a and 7b are each a perspective view of a conventional magnetic field detector applicable to this invention.
Figure 7B:
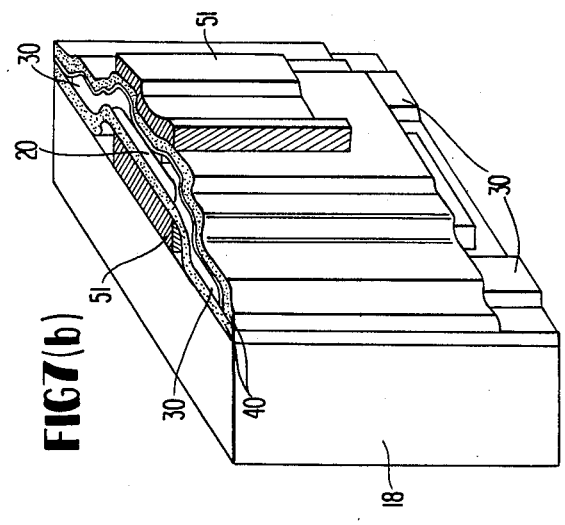

Two other examples of the magnetic field detector 18' are illustrated in FIGS. 7a and 7b, respectively. In both instances, two thin films 51 of a high permeable material are provided so as to have the MR 20 therebetween. More specifically, in FIG. 7a, the two thin films 51 are positioned on the base 18 in a plane including the MR 20. Such a detector as shown in FIG. 7a is applicable to the arrangement of FIGS. 1a and 1b since the surface of the MR 20 is parallel to that of the medium 12. On the other hand, in FIG. 7b, the thin films 51 are laminated having the MR 20 therebetween through the insulative layers 40. Such a detector as shown in FIG. 7b is applicable to the arrangement of FIGS. 5a and 5b since the surface of the MR 20 is perpendicular to that of the medium 12. Techniques for increasing the resolution of MR elements by providing a highly permeable material have been known in the art. With these arrangements, even if the pitch p of the medium 12 is shortened, the resistance change of the MR 20 does not decrease in its magnitude. As a consequence, the rotary means 13 can be reduced in size while providing a high resolution of the rotary conditions of the shaft 11. It should be noted in these arrangements that the plane of the thin film 51 should be arranged in parallel to the direction of the magnetic flux from the medium 12. One of the two films 51 can be omitted while maintaining a high resolution of the rotary conditions, but it is of usual practice to use two films. The arrangements of FIGS. 6a, 6b, and 6c, wherein the direction of magnetization M is slanted by an angle of 45° with respect to that of the sense current Is, are applicable to either of the arrangements of FIGS. 7a and 7b.

The experiment by the inventors teaches that the following conditions should be required in order to secure reliable detection of the magnetic signals recorded on the medium 12 by each MR of FIGS. 1a, 1b, 5a, 5b, 6a, 6b, 6c, 7a, and 7b:

(I) The width D of the MR 20 should not be in excess of 20p but equal to or less than p.sec. $\phi$, wherein $\phi$ is an angle defined by the surfaces of the medium 12 and the MR 20;

(II) The MR 20 is arranged relative to the medium 12 such that the nearest portion of the MR 20 is not spaced by more than 2p from the medium 12, and the furthest portion of the MR 20 is not spaced by more than 20p from the same;

(III) each boundary dividing the adjacent magnetic sections of the medium 12, which is depicted by a broken line in FIGS. 1a, 1b, 5a, and 5b, is parallel to the longitudinal line of the MR 20, or within an angle of ±45° therefrom. Besides the above-mentioned conditions, the following condition should preferably be met although not so strictly:

(IV) the length w of the MR 2Q is equal to or less than 20, where Q is the width of the magnetic section.

It should be noted that each of the preferred embodiments thus far described is provided with only one magneto-resistor, considering the conditions (I)–(IV).

The following embodiments of this invention each includes a plurality of magneto-resistors, wherein it is assumed that they are provided under the above conditions (I)–(III) or (I)–(IV).

Figure 8A:
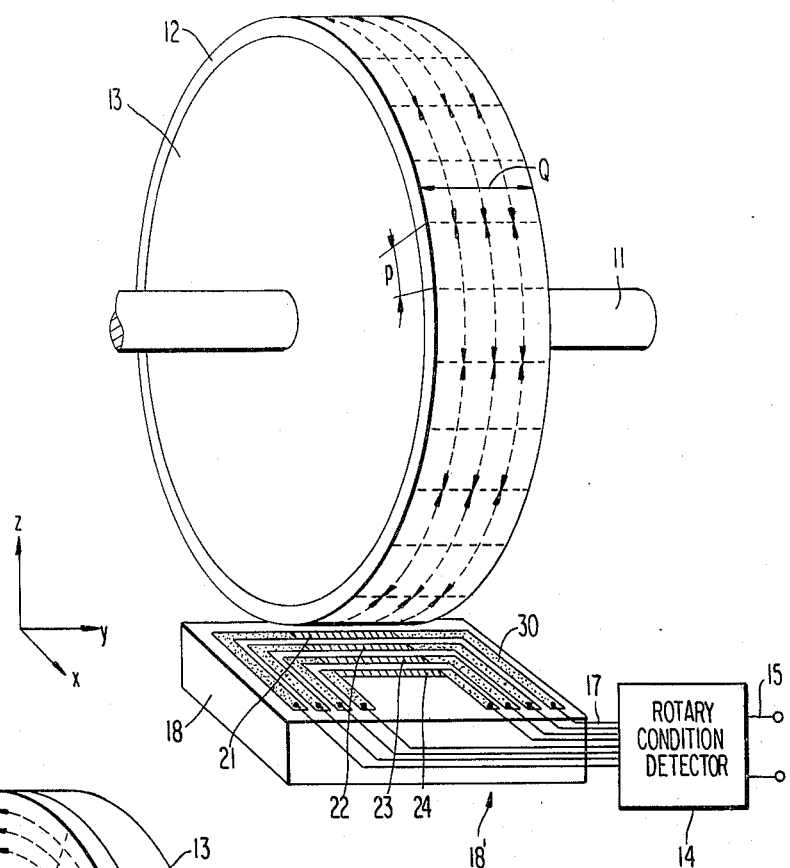
FIG. 8a is a perspective view of a third embodiment of this invention.

In FIG. 8a, a third embodiment of this invention is schematically illustrated, wherein four MRs 21, 22, 23, and 24 are arranged and coupled to the rotary condition detector 14 through conductive strips 30 and leads 17. This embodiment corresponds to the respective arrangements of FIGS. 1a and 1b, so each of the magneto-resistors 21–24 is subject to its resistance change in response to the magnetic field in the direction of x-axis, i.e., $H_x$.

Figure 8B:
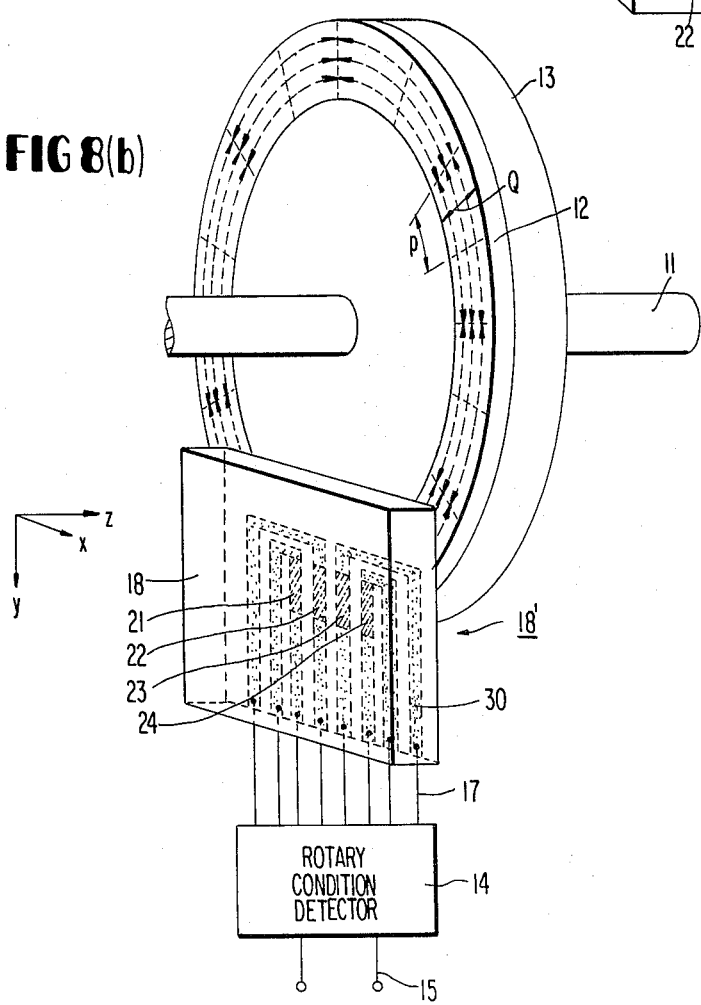

FIG. 8b schematically illustrates a modification of FIG. 8a which is similar to the embodiment of FIG. 1b. As a result, each resistance of the MRs 21–24 of FIG. 8b changes in response to $H_x$ just like the FIG. 8a arrangement.

Figure 9A:
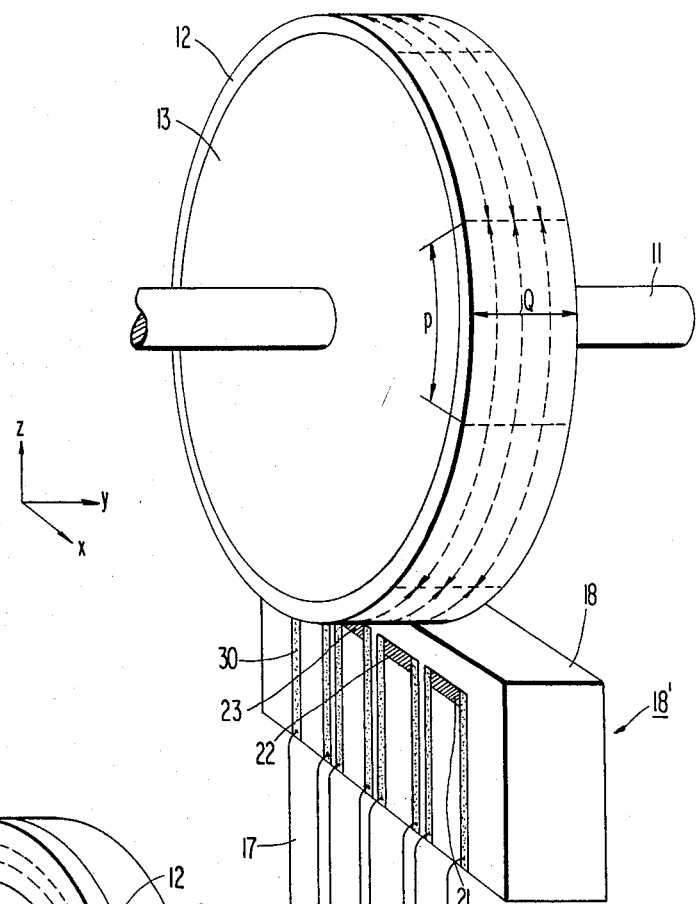
FIG. 9a is a perspective view of a fourth embodiment of this invention.
Figure 9B:
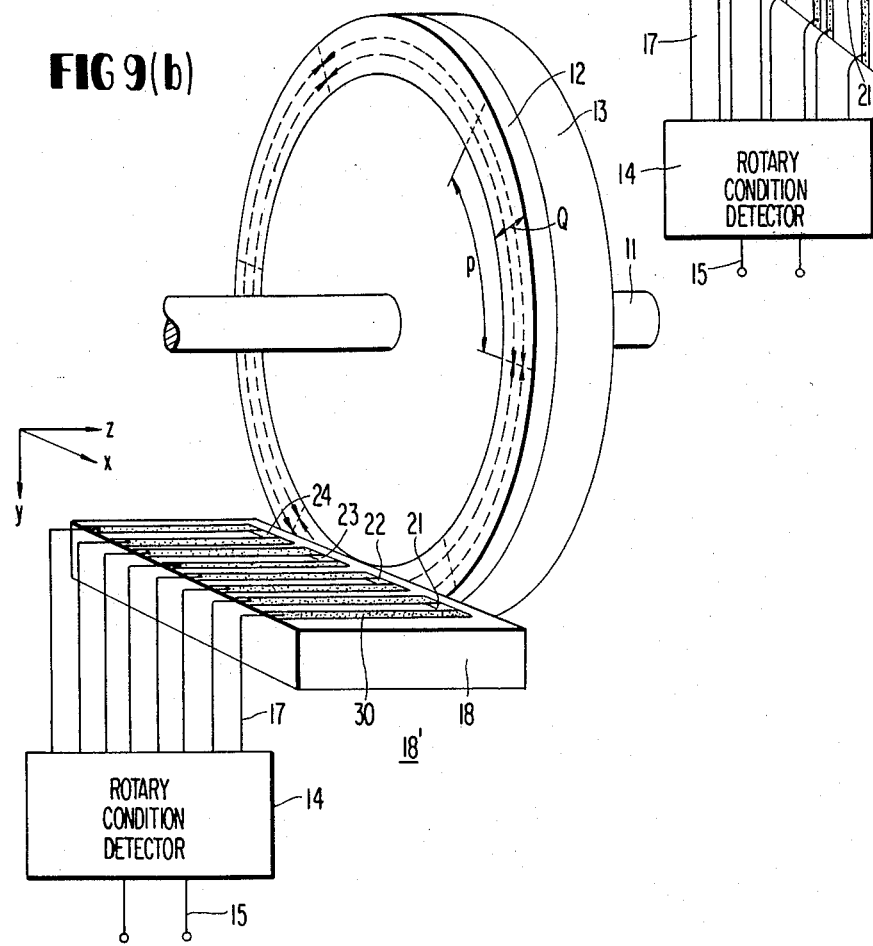

FIGS. 9a and 9b show a fourth embodiment and its modification, respectively, which are similar to the arrangements of FIGS. 5a and 5b. Each embodiment of FIGS. 9a and 9b includes four magneto-resistors 21–24, whose resistances change in response to the magnetic field in the direction of z-axis, i.e., $H_z$. The difference between the third and fourth embodiments is that the MRs of the former respond to $H_x$ whereas the MRs of the latter to $H_z$.

Since the embodiments of FIGS. 8a, 8b, 9a, and 9b have similar functions with one another, the embodiment of FIG. 8a will be representatively referred to in connection with FIGS. 10(a) through (g) and FIGS. 11(a) through (g).

In FIG. 10(a), a portion of the detector 18' of FIG. 8a is schematically illustrated together with that of the medium 12. In this arrangement, only the three MRs 21, 22, and 23 (width D, length w) are shown and are spaced from one another as follows:

$S_{21,22} = p$
$S_{22,23} = 2p$
$S_{21,23} = 3p$

Wherein the two suffixes attached to the letter S indicate the reference numerals of the MR, and therefore, $S_{21,22}$ defines the distance between the MRs 21 and 22, for example.

FIGS. 10(b) and 10(c) are curves respectively showing the magnitude of the magnetic signal $M_\theta$ and $H_x$, as a function of the angular distance $\theta$ of the drum 10 (not shown). Respective resistance change of the MRs 21, 22, and 23, which are depicted by $R_{21}$, $R_{22}$, and $R_{23}$, can be obtained by deviating $S_{i,j}$ from the curve shown in FIG. 4(a). In the case of FIG. 10(a), however, since the spacings are the pitch p and its integral multiples, the phases of $R_{21}$, $R_{22}$, and $R_{23}$ are superimposed as shown in FIG. 10(d). Therefore, generally speaking, if a spacing between two MRs is the pitch p or its integral multiples, or in other words, if $S_{i,j} = k.p$ (where $k = 1, 2, 3, \ldots$) then the resistance changes $R_i$ and $R_j$ have the same phase.

In the case where the high permeable magnetic plates 51 of FIG. 7a are provided in the arrangement of FIG. 10(a), the resistance changes $R_{21}$, $R_{22}$, and $R_{23}$, which are shown in FIG. 10e, have the same phases as in FIG. 10(d), have sharp peaks in the vicinity of the boundaries dividing the magnetic sections of the medium 12. This means that the magnetic signals on the medium 12 are detected more accurately than in the arrangement of, for example, FIG. 10(d).

Where one of the techniques of FIGS. 6a through 6c is applied to the arrangement of FIG. 10(a), the resistance changes of $R_{21}$, $R_{22}$, and $R_{23}$ are shown in FIG. 10(f). With this arrangement, respective resistance changes of the MRs 21, 22, and 23 can be obtained by deviating $S_{i,j}$ from the curve shown in FIG. 4(d). As a result, $R_{21}$ is different in phase by p from $R_{22}$ and $R_{23}$, and whereas $R_{22}$ is identical in phase with $R_{23}$. It is therefore concluded that if one of the techniques shown in FIGS. 6a through 6c is applied to the arrangement of FIG. 10(a), MRs having the relation of $S_{i,j} = 2k.p$ have the same phase resistance change.

FIG. 10(g) shows curves of the resistance changes $R_{21}$, $R_{22}$, and $R_{23}$ when the high permeable magnetic plates 51 is provided in the arrangement of FIG. 10(a) and at the same time either technique of FIGS. 6a through 6c is applied to the same. In this arrangement, the resistance change $R_{21}$ is different in phase by the pitch p from $R_{22}$ and $R_{23}$, just as in FIG. 10(f). Furthermore, the resistance changes $R_{21}$, $R_{22}$, and $R_{23}$ have sharp changes in the vicinities of the boundaries dividing the magnetic sections of the medium 12.

Figure 11:
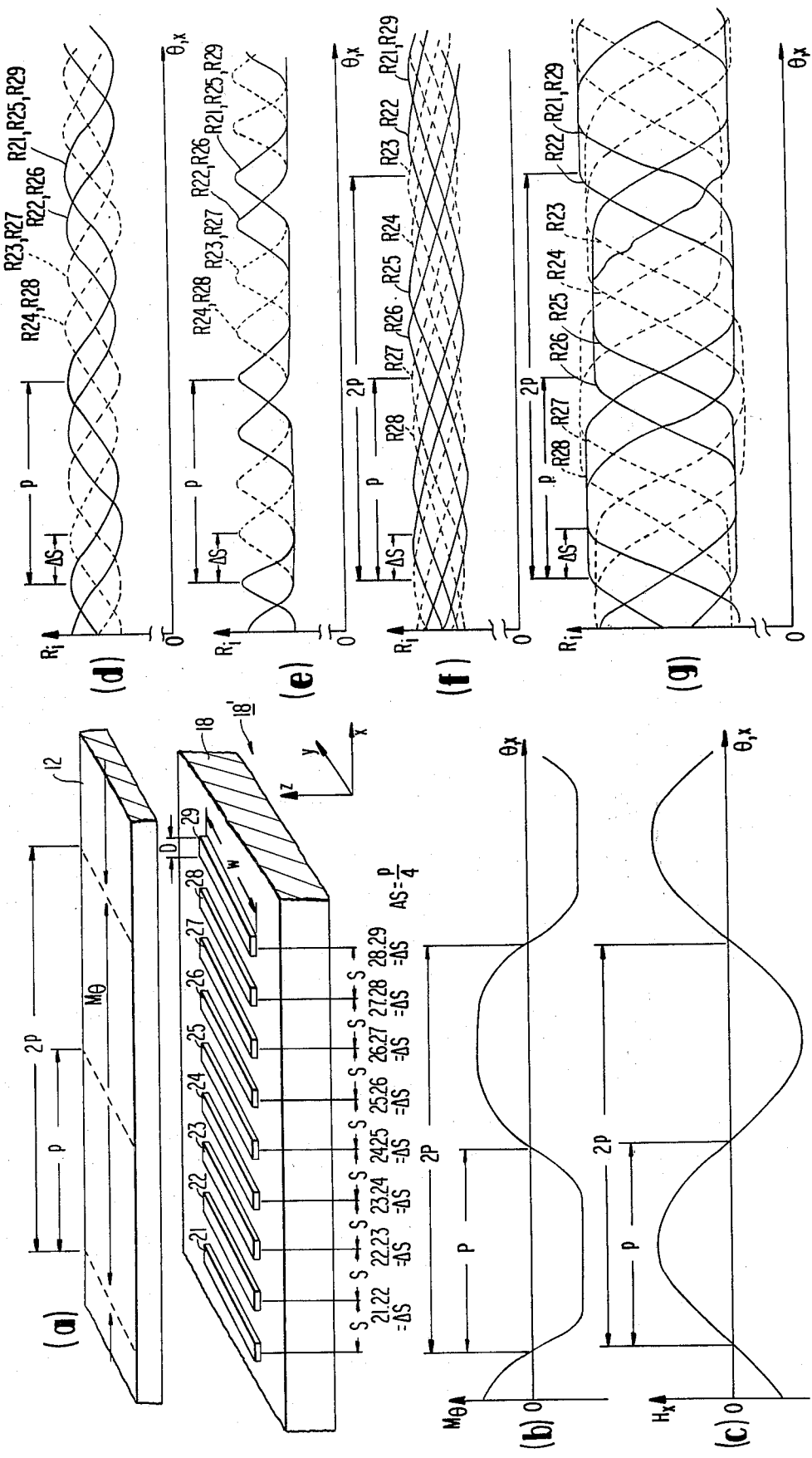

FIG. 11(a) exemplifies a portion of another magnetic field detector 18' together with j corresponding portion of the medium 12, according to this invention. With this arrangement, eight magneto-resistors viz., MRs 21 through 29 are regularly arranged at a spacing of $S_{i,i+1} \Delta S = p/4$ (where, $S_{i,i+1}$ is a spacing between $MR_i$ and $MR_{i+1}$, and $i = 21, 22, \ldots, 27$, and 28).

FIGS. 11(b) and 11(c) are curves respectively showing the magnitude of the magnetic signals $M_\theta$ recorded on the medium 12 and $H_x$, both as a function of the angular distance $\theta$ of the drum 13 (not shown). With this arrangement, the MR 21 through the MR 29 have respectively resistance changes $R_{21}$–$R_{29}$ as shown in FIG. 11(d) wherein any two MRs spaced by $S_{i,j} = k \cdot p$ ($k = 1, 2, 3, \ldots$) have same phase resistance changes, so that there are four different curves as a whole.

FIG. 11(e) shows curves of the resistance changes $R_{21}$ through $R_{29}$, where the high permeable magnetic plates 51 of FIG. 7a are provided in the arrangement of FIG. 11(a). In this case, just as in FIG. 10(e), the resistance changes $R_{21}$ through $R_{29}$ have high rates of change in the vicinities of the boundaries dividing the magnetic sections of the medium 12, whereas they have the same phases as in FIG. 11(d).

FIG. 11(f) are curves of the resistance changes $R_{21}$ through $R_{29}$ when one of the techniques of FIGS. 6a, 6b, and 6c is used in the arrangement of FIG. 11(a). With this arrangement, since only the MRs 21 and 29 are spaced by 2p, there appear eight curves each having a phase difference of p/4 ($\Delta S$) relative to its adjacent curve. This arrangement is similar to that of FIG. 10(f).

FIG. 11(g) illustrates curves of the resistance changes $R_{21}$ through $R_{29}$ where the arrangement of FIG. 11(a) is provided with the high permeable magnetic plates 51 of FIG. 7a as well as either arrangement of FIG. 6a through 6c. Each of eight different curves is deviated in phase by p/4 from adjacent ones just as in FIG. 11(f), and having abrupt changing rates near the boundaries dividing magnetic sections of the medium 12.

Figure 12A:
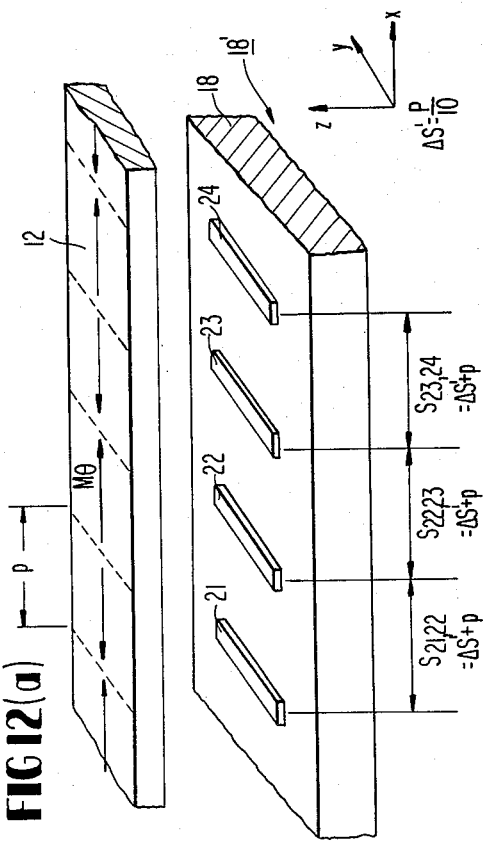
Figure 12B:
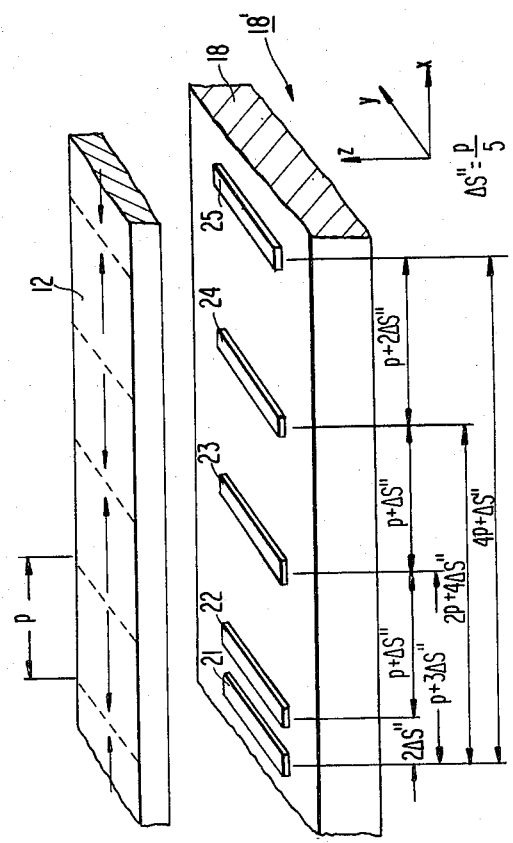

In addition to the arrangement of FIG. 11(a), other examples are shown in FIGS. 12a and 12b for obtaining a plurality of resistance changes different in phase.

In FIG. 12a, the four MRs 21–24 are spaced on the base 18 at an equal distance $S_{i,i+1} = \Delta S' + p$ (where $\Delta S' = p/10$, and $i = 21, 22,$ and 23). With this arrangement, all MRs have resistance changes having a phase difference of $\Delta S'$ with respect to adjacent ones.

FIG. 12b illustrates five magneto-resistors, i.e., the MRs 21 through 25 arranged to have spacings as follows:

$S_{21,22} = 2 \cdot \Delta S''$
$S_{22,23} = p + \Delta S''$
$S_{23,24} = p + \Delta S''$
$S_{24,25} = p + 2 \cdot \Delta S''$ It is understood that the MR 25 is spaced by $4p + \Delta S''$ from the MR 21 and by $4p - \Delta S''$ from the MR 23, whereas the MR 23 is spaced by $p + \Delta S''$ from each of the MRs 22 and 24. As a consequence, we can obtain five different resistance changes equally differing in phase by $\Delta S''$.

We can get a general principle from the foregoing that if the following equation is satisfied, "h" resistance changes differing in phase are derived from "T" different MRs:

$$S_{i,j} = \left| l \cdot \frac{p}{h} + k \cdot p \right|$$

where $h = 2, 3, 4, \ldots$ ($h \leq T$)
$l, k = 0, \pm 1, \pm 2, \pm 3, \pm 4, \ldots$
$i, j = 1, 2, 3, \ldots$ It should be however noted that p/h, which indicates a minimum phase difference, should be more than $\delta H \cdot p/2$ ($\delta H$ is a phase variation due to noises referred to later). In other words, $h < 2\pi/\delta H$ must be satisfied.

FIG. 13 illustrates, in a block form, the units comprised in the detector 14, together with the conductive strip 31 of FIG. 6a, the MRs 20 and 20', the brush 19, and the shaft 11 with the reference mark 10. It should be noted that (1) more than the two MRs 20 and 20' may be provided although not shown in FIG. 13, and (2) the conductive strip 31 has to be omitted if the arrangement of FIG. 6a is not used. A dc power source 200 applies predetermined direct currents to the conductive strip 31, the MRs 20 and 20', and the units of the detector 14 through ten conductive lines P1–P10, respectively. As referred to in connection with FIG. 1a, the mark 10 is made of insulative material such as glass. When the brush 19 contacts the mark 10, an electrical signal is detected which represents an abrupt resistance change indicative of the reference angular position ($\theta = 0$). The signal from the brush 19 is fed to a reference position detecting circuit 14-6 which in turn applies a reference signal to the pulse counter 14-5. The counter 14-5, upon reception of this signal, is reset to zero when the rotating direction of the rotary means 13 is positive, and is set to the number of N ($N = 2\pi/\Delta\theta$) when negative, wherein $\Delta\theta$ is the minimum angular determining unit indicative of the increment of the rotation angle of said rotary means 13. The resistance changes of the MRs 20 and 20', which are depicted $R_i$ and $R_j$ are obtained as analog voltage changes across the MRs 20 and 20'. The voltage signals from the MRs 20 and 20' are applied to amplifiers 14-1 and 14-1' and amplified therein. The amplified signals ($V_i$ and $V_j$) from the amplifiers 14-1 and 14-1' are then given to pulse circuits 14-2 and 14-2' and are converted into trains of pulses ($V_{pi}$ and $V_{pj}$). The pulses $V_{pi}$ and $V_{pj}$ are then fed to counter 14-5 which counts the applied pulses every minimum angular determining unit $\Delta\theta$ for determining angular displacement of the shaft 11. The unit $\Delta\theta$ will be discussed in detail later. A digital signal, indicative of the number of the pulses counted by the counter 14-5, is fed to the next stages, viz., a BCD (binary coded decimal) converters 14-7 and also to a D/A (digital to analog) converter 14-8. The BCD converter 14-7 generates a digital signal representative of the angular displacement in BCD code, while the D/A converter 14-8 generates an analog signal representing the same information. A phase difference detector 14-3 detects a phase difference $\Delta H$ between two analog outputs from the amplifiers 14-1 and 14-1' and determines the rotating direction of the rotary means 13 based on whether the $\Delta H$ is positive or negative. On the other hand, another phase difference detector 14-4 detects a phase difference $\Delta H_p$ between two pulsating outputs of the pulse circuits 14-2 and 14-2' and also determines the rotating direction of the rotary means 13. The counter 14-5, upon receipt of the pulse from the pulse circuits 14-2 and 14-2', counts up from zero when the $\Delta H$ is positive, and counts down from the predetermined number N when the $\Delta H$ is negative. The blocks 14-1, 14-1', 14-2, 14-2', 14-7, 14-8, 14-3, and 14-4 produce their electrical outputs, through terminals $T_1$, $T_1'$, $T_2$, $T_2'$, $T_3$, $T_4$, $T_5$, and $T_6$, respectively, to external circuits (not shown). When the output of the pulse counter 14-5 is reset to zero every suitable time interval, an output proportional to the rotation speed of the rotary means 13 is derived therefrom through each of the terminals $T_3$ and $T_4$.

Details of the construction and functions of the amplifiers 14-1 and 14-1', the pulse circuits 14-2 and 14-2', the phase difference detectors 14-3 and 14-4 of FIG. 13 will be given hereunder in detail. All of these blocks are concerned with the arrangement of the MRs 20 and 20'. However, details of the power source 200, the pulse counter 14-5, the reference position detector 14-6, the BCD converter 14-7, and the D/A converter 14-8 will not be given hereunder because they are well known to those skilled in the art.

Figure 14A:
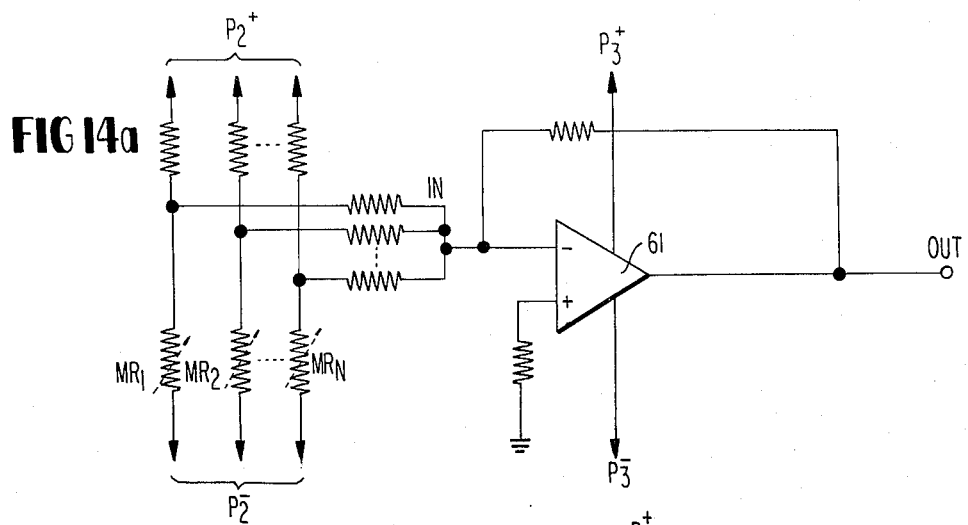
FIGS. 14a through 15b are each a detailed circuit diagram of the block shown in FIG. 13.

FIG. 14a is a detailed circuit diagram of the amplifiers 14-1 and 14-1' of FIG. 13, wherein a plurality of magneto resistors, which are respectively depicted $MR_1$ to $MR_N$, are arranged such as to have resistance changes with the same phase with one another, just as shown in FIG. 10(d) or 10(e). A dc power is supplied to the MRs through the terminals P2. The signal derived from the MRs are added and then fed to the inverting input terminal of an operational amplifier 61 and amplified therein. This configuration is such that noises from the MRs are averaged, so that S/N (signal to noise ratio) of the present encoder can be improved further. It is apparent that if only one magneto resistor (for example, $MR_1$) is used, the others $MR_2$ to $MR_N$ should be omitted, in which only one signal is fed to the operational amplifier 61.

Figure 14B:
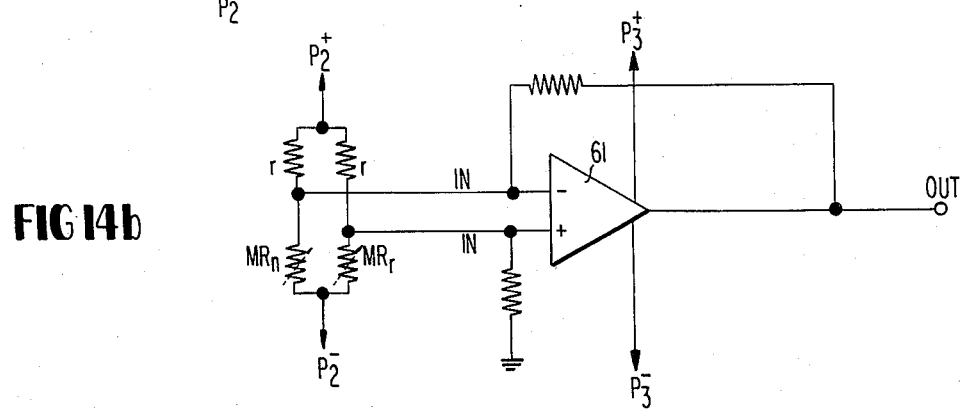

FIG. 14b is another circuit diagram of the amplifiers 14-1 and 14-1' of FIG. 13, wherein $MR_n$ and $MR_r$ have resistance changes different in phase by $\pi$. This can be applied to the case of FIG. 10(f). More specifically, the $MR_n$ corresponds to the MR 21, and the $MR_r$ corresponds to the MR 22 or MR 23. Each of the $MR_n$ and the $MR_r$ is coupled to the dc power supply terminals P2 through a resistor r, and also coupled to the input terminals of an operational amplifier 61. The amplifier 61 doubles the input signal, cancelling the common mode noises.

Returning to FIG. 14a, if the resistance changes $R_i$ shown in FIGS. 10(d), 10(e), 10(f), 10(g), 11(d) and 11(f) are applied to the inverting input terminal of the amplifier 61 of FIG. 14a, then voltage signals $V_i$ shown in FIGS. 16(b), 16(e), 16(h), 16(k), 17(b) and 17(f) can be respectively derived from the output terminal OUT.

Figure 15A:
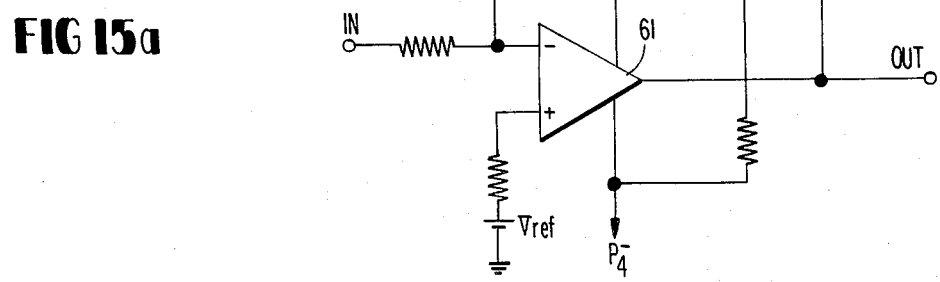

FIG. 15a illustrates a circuit diagram of the pulse generators 14-2 and 14-2' of FIG. 13. Analog signals derived from the amplifiers 14-1 and 14-1' of FIG. 13 are given to the inverting input terminal of an operational amplifier 61 through a terminal IN. The analog signals are then converted into pulses by means of a threshold voltage $V_{ref}$ applied to the non-inverting terminal of the amplifier 61'. If the output voltages $V_i$ as shown in FIGS. 16(b), 16(e), 16(h), 16(k), 17(b) and 17(f) are sent to the pulse generator of FIG. 15a, resultant pulse trains $V_{pi}$ and $V_{pj}$ are as shown in FIGS. 16(c), 16(f), 16(i), 16(l), 17(c) and 17(g).

Figure 15B:
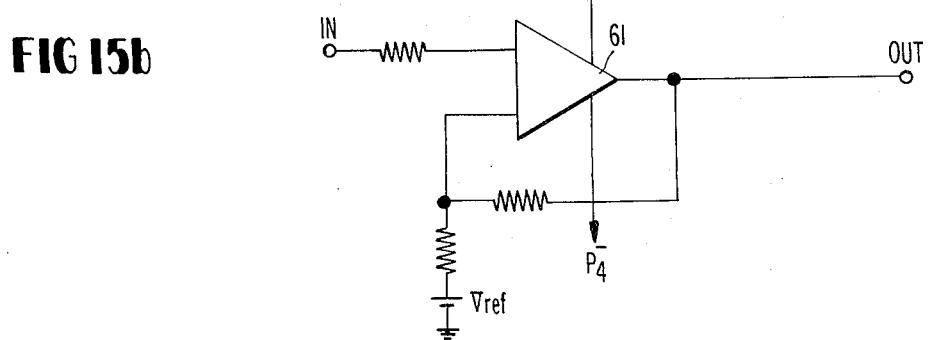

FIG. 15b exemplifies another circuit diagram of the pulse generators 14-2 and 14-2', wherein the operational amplifier 61' is used to construct a Schmitt trigger circuit. The analog signals are applied to Schmitt trigger circuits so that triggering at two different threshold $V_1$ and $V_2$ can be carried out. Thus, the Schmitt trigger circuit produces a square-wave having a hysteresis defined by $V_1$ and $V_2$. FIGS. 16(d), 16(g), 16(j), and 16(m) and curves showing pulse trains $V'_{pi}$ derived from the pulse generator shown in FIG. 15b, when the analog signals as shown in FIGS. 16(b), 16(e), 16(h), and 16(k) are respectively applied to the same. By use of the pulse generator of FIG. 15b, undesirable pulse trains can be suppressed which have relatively short pulse widths due to small mechanical vibrations of the rotary drum 13, thus increasing reliability of the magnetic encoder.

If the amplifiers 14-1 and 14-1' of FIG. 14b are employed in combination with the pulse generator 14-2 and 14-2' of FIG. 15a (in this case, $V_{ref}$ is clamped zero), the generators 14-2 and 14-2' produce leading or trailing edges every time the resistance of the $MR_n$ becomes equal to that of the $MR_r$. This combination has the advantage that even if mechanical vibration causes a distance change between the MR and the medium 12 and as a consequence changes the magnitude of each of the outputs from MRs, the angular velocity as well as incremental angular displacement can be accurately detected. This is because the mechanical vibrations do not affect the angular distance where the two MRs have the same value. Thus, the above combination can increase the reliability of the magnetic encoder. By use of the above combination, the detected signals as shown in FIGS. 11(d) and 11(f) are converted into pulse trains as shown in FIGS. 17(d) and 17(h), respectively. It should be noted however that the above-mentioned pulse generating technique is not limited to the fact that the two MRs ($MR_n$, $MR_r$) of FIG. 14b have resistance changes differing in phase by $\pi$. It requires only that the two MRs have the same resistance value twice during one period. Because the circuit of FIG. 14b produces zero if their resistance values are identical, the signals shown in FIG. 11(d) and 11(f) are converted, through the circuit of FIG. 15a, into pulse trains of FIGS. 17(e) and 17(i). In FIGS. 17(g), 17(h), and 17(i), portions of pulse waves are omitted for simplicity of drawings.

The minimum angular determining unit $\Delta\theta$ will be discussed in more detail. When the resistance changes of MRs are as shown in FIG. 10(d) and 10(e), pulse trains are obtained as shown in FIGS. 16(c)-16(d) and FIGS. 16(f)-16(g), respectively. Therefore, the pitch p determines $\Delta\theta$, so that we obtain:

$$\theta = \frac{2\pi}{N} = \frac{2\pi}{\frac{2\pi R}{p}} = \frac{p}{R} \tag{1}$$

where R = an inner radius of the medium 12.

On the other hand, when the resistance changes of MRs are as shown in FIG. 10(f) and 10(g), pulse trains are obtained as shown in FIGS. 16(i)-16(j) and 16(l)-16(m), respectively. In this case, although the period is 2p, two pulse trains with different phase are derived. As a result, if the leading edges are used to detect the rotary conditions of the rotary means 13, we obtain:

$$\Delta\theta = \frac{2\pi}{N} = \frac{2\pi}{\left(\frac{2\pi R}{2p}\right) \times 2} = \frac{p}{R} \tag{2}$$

Whereas, the analog signals as shown in FIGS. 11(d) and 11(e) are converted into corresponding pulse trains as shown in FIGS. 17(c), 17(d), or 17(e). With this arrangement, there are four independent pulse trains within one pitch p, so that we obtain:

$$\Delta\theta = \frac{2\pi}{N} = \frac{2\pi}{\frac{2\pi R}{p} \cdot 4} = \frac{p}{4R} \tag{3}$$

It is understood that this arrangement has four times the angular resolution of that of FIGS. 10(d) and (e).

Furthermore, if the techniques as previously mentioned in connection with FIGS. 17(d) and 17(e) are used simultaneously, or, in other words, four independent pulse trains are employed, so the minimum angular determining unit is:

$$\Delta\theta = \frac{2\pi}{N} = \frac{p}{8R} \qquad (4)$$

In the arrangements of FIGS. 11(f) and 11(g), their corresponding pulse trains are as shown in FIGS. 17(g) through 17(i). Since there are eight independent pulse trains during 2p, the minimum angular determining unit is:

$$\Delta\theta = \frac{2\pi}{N} = \frac{2\pi}{\frac{2\pi R}{2p} \times 8} = \frac{p}{8R}. \qquad (5)$$

Furthermore, if the technique employed for obtaining the equation (4) is applied to the cases of FIGS. 17(h) and 17(i), sixteen independent pulse trains exist within 2p. Therefore, the minimum angular determination unit is:

$$\Delta\theta = \frac{2\pi}{N} = \frac{p}{16R} \qquad (6)$$

From the foregoing, a general principle can be derived for determining the minimum angular determining unit:

$$\Delta\theta = \frac{ap}{mR} \qquad (7)$$

where a, p, m, R have been already referred to, but $m \leq h(h-1)$.

Figure 18A:
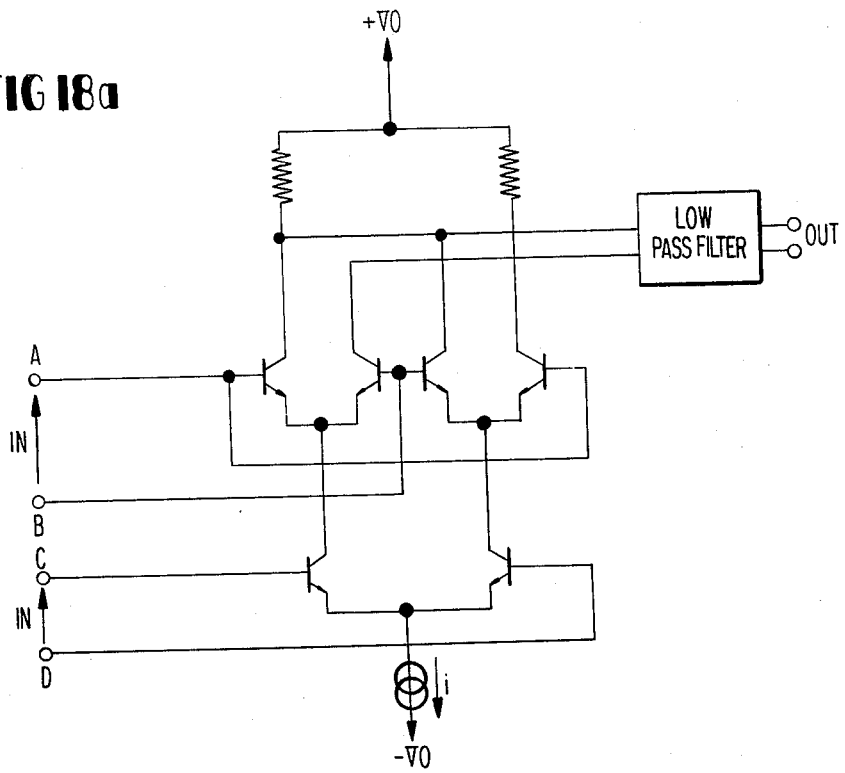
FIGS. 18a and 18b are detailed circuit diagrams of one block shown in FIG. 13.

FIG. 18a is a conventional circuit diagram of the phase difference detector 14-3 for detecting the phase difference based on the applied analog signals. Two analog signals $V_i$ and $V_j$ having different phases are given to differential amplifiers through terminals A-B and C-D, respectively. The outputs of the differential amplifiers are fed to a low-pass filter, from which is derived a signal proportional to their phase difference $\Delta H_{i,j}$. For example, in the arrangement of FIG. 11(a), if the medium 12 moves in the negative direction of x-axis, the $R_{21}$, $R_{25}$, or $R_{29}$ lags by $\Delta S$ with respect to the remaining resistance changes. On the other hand, if the medium 12 moves in the opposite direction, $R_{21}$, $R_{25}$, or $R_{29}$ advances by $\Delta S$ relative to the remaining resistance changes. Therefore, the phase difference $\Delta H$ changes its polarity in response to the rotating direction of the rotary means 13.

Figure 18B:
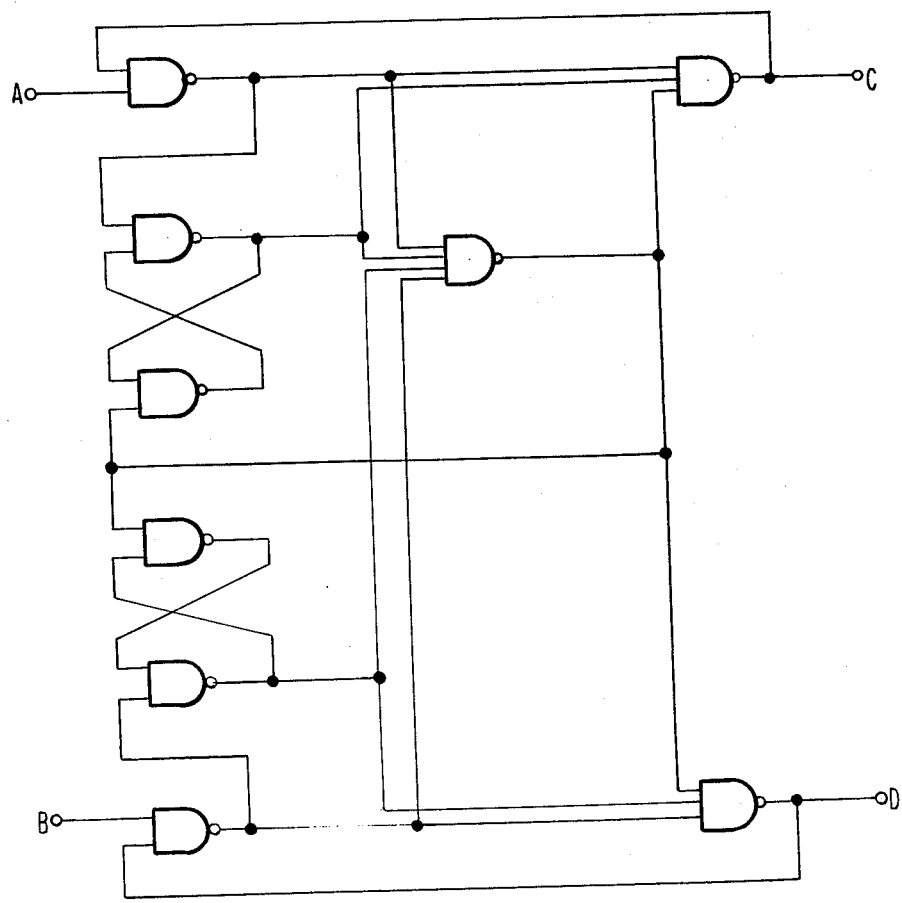

FIG. 18b is a conventional circuit diagram of the phase detector 14-4 for detecting the phase difference based on the applied digital signals. The detector 14-4 comprises nine NAND gates whose functions will be apparent to those skilled in the art. In the arrangement of FIG. 11(a), if the medium 12 moves in the negative direction of x-axis, the phase of the pulse train $V_{p21}$, $V_{p25}$, or $V_{p29}$ lags relative to the phases of the other pulse trains. On the other hand, if the medium 12 moves in the opposite direction, the phase of the pulse train $V_{p21}$, $V_{p25}$, or $V_{p29}$ advances relative to the other pulse trains. Two of these pulses are fed to the detector 14 through A and B. If the trailing edge of the pulse train applied to the input terminal A leads that given to the input terminal B, the output terminals C and D produce a logic "1" and "0", respectively. Otherwise, the output terminals C and D product a logic "0" and "1", respectively. Thus, the detector 14-4 can detect the rotating direction of the rotary drum 13.

In order to obtain a high resolution of rotary conditions, the resistance change in MR should not be adversely affected by noises. For this purpose, where a plurality of MRs are employed, the minimum phase difference between resistance changes should be greater than $\delta H$, wherein $\delta H$ is a phase deviation due to noises arising from amplifiers, small mechanical vibrations, etc. Therefore, a minimum spacing between the MRs is:

$$Sm > \frac{\delta H}{2\pi} \cdot p$$

There will be hereinafter referred to the materials as well as the configurations of the members which are employed in the above-mentioned embodiments of this invention.

The rotating means 13 is preferably made of metal or plastics in view of process accuracy and high resistance against external shocks. More specifically, for lessening the weight of the rotating means 13, it should be made of aluminium, aluminium alloy, or plastics. Whilst, if process accuracy must be taken into account, brass is preferred, and for the purpose of chemical stability the rotating means 13 should be made of stainless-steel.

The magnetic medium 12 is required to assure that the magnetic information is reliably recorded on it. For this purpose, its coercive force must be over at least 100 Oersted, so that the medium 12 is preferably a plated film of Co-P or Co-Ni-P alloy, or being made by binding magnetic fine particles on the surface of the means 13 by the use of suitable binding agent. The magnetic fine particles include ferrite or chromium oxide as the main ingredient. The magnetic information or signals are then recorded on the medium 12 by using such techniques as well known to those skilled in the art.

The permanent magnets 19 are usually made of a material selected from the group: either of the materials used in the magnetic medium 12; barium ferrite having coercive force well over 100 Oersted; plastic magnet consisting of plastic rubber having barium ferrite fine particles dispersed therein; and a material consisting mainly of nickel, iron, cobalt, aluminium, or rare earth elements.

The magneto-resistors 20, 21, . . . , 29 are made of metal such as iron, nickel, or cobalt, or made of an alloy consisting chiefly of such metal. Above all, an alloy including over 40% (percent) nickel or about 5% cobalt has good magneto-resistors characteristics, and therefore is most desirable. The conductive film 30, 31, and 32 are usually made of such metals as gold, aluminum, or copper, or a thin-film consisting chiefly of such metal alloy. Silicon oxide, aluminium oxide, or glass is prepared for the insulative thin plate 40.

The hard magnetic film 50 is made of the materials used in the magnetic medium 12. The high permeable magnetic plate 51 is made of an alloy (for example, permalloy) consisting chiefly of iron and nickel. As to the base 18, silicon single crystal plate or glass plate having a smooth surface is preferred. The brush 19 should be electrically conductive and withstand wear, and therefore a carbon rod is suitable. The reference mark 10 attached to the rotatable shaft 11 is an insulative thin plate made of such as glass, plastics, or metal oxide.

Figure 19:
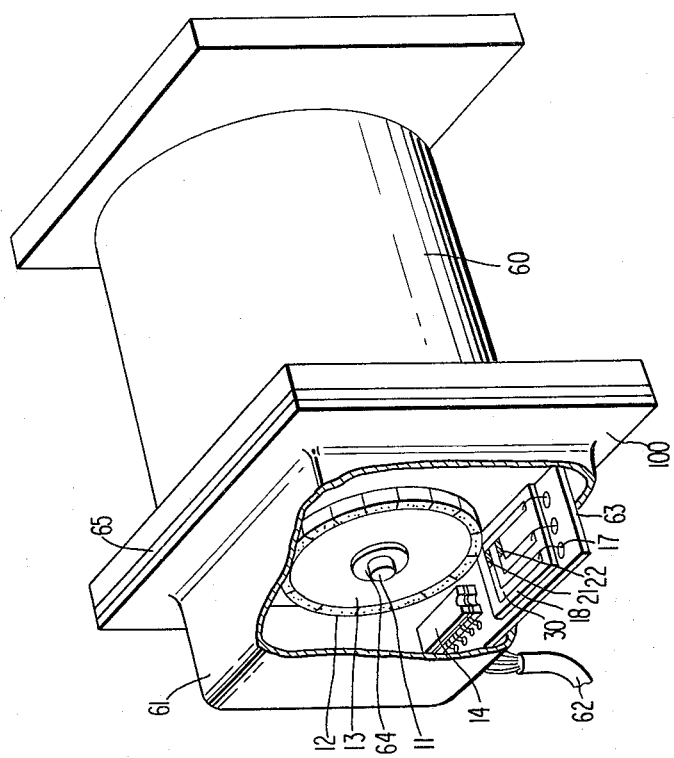
FIG. 19 is a perspective view showing one application of this invention to a motor.

FIG. 19 is a partly broken perspective view showing one application of the arrangement of FIG. 8A to a motor. The drum type rotating means 13 made of aluminium alloy has a diameter 40 mm (millimeters) and a thickness 10 mm (millimeters), and is provided with the magnetic medium 12 plated on its peripheral surface. The rotary means 13 is fixedly attached, by means of fastener 64, to the rotatable shaft 11 of the motor installed within a housing 60. The medium 12 is made of Co-P alloy having a coercive force of about 200 Oersted and having a thickness 10 micro meters. The medium 12 consists of 50 magnetic sections each having a magnetic signal. The magnetic sections are formed such that their boundaries are perpendicular to the direction of the rotation of the drum 13, so that the pitch p is about 2.5 mm. Although the MRs 23 and 24 are not shown in FIG. 19 for simplicity, each is identical to the MRs 21 and 22 in dimensions, characteristics, etc. Specifically, each of the MRs 21 and 22 has a width of 20 microns and a length of 10 mm, and it is provided on the base 18. The detector 14 is mounted on the printed board 63 and is coupled to the MRs 21 and 22 through conductive leads 17 as well as the conductive thin-films 30. A housing 61 encases a magnetic rotary encoder unit 100 comprising the detector 14, the base 18, the rotary means 13, etc. A cable 62 is provided for deriving output signals from the encoder unit 100 and for applying a power source to the encoder unit 100. It should be noted that the reference mark 10 as well as the brush 19 are not shown in FIG. 19 for simplicity. The printed board 63 is also used for intermediate electrical connections between the detector 14 and the MRs 21 and 22. A plate 65 is for shielding magnetic flux generated by the motor.

Because of small mechanical vibrations and electrical component noises, the output signal of the magnetic encoder 100 is experimentally found to include the phase deviation δH satisfying the following:

$$\delta H \leq \pm 2\pi \times \frac{2}{360} \text{ (radian)}$$

where it is assumed that the pitch p corresponds to the phase difference $2\pi$. Whilst, if the MRs 21 through 24 are arranged at an equal spacing of p/4 as in FIG. 11(a), the phase difference of the signals from MRs is:

$$\Delta H = \frac{\pi}{2}$$

Figure 16:
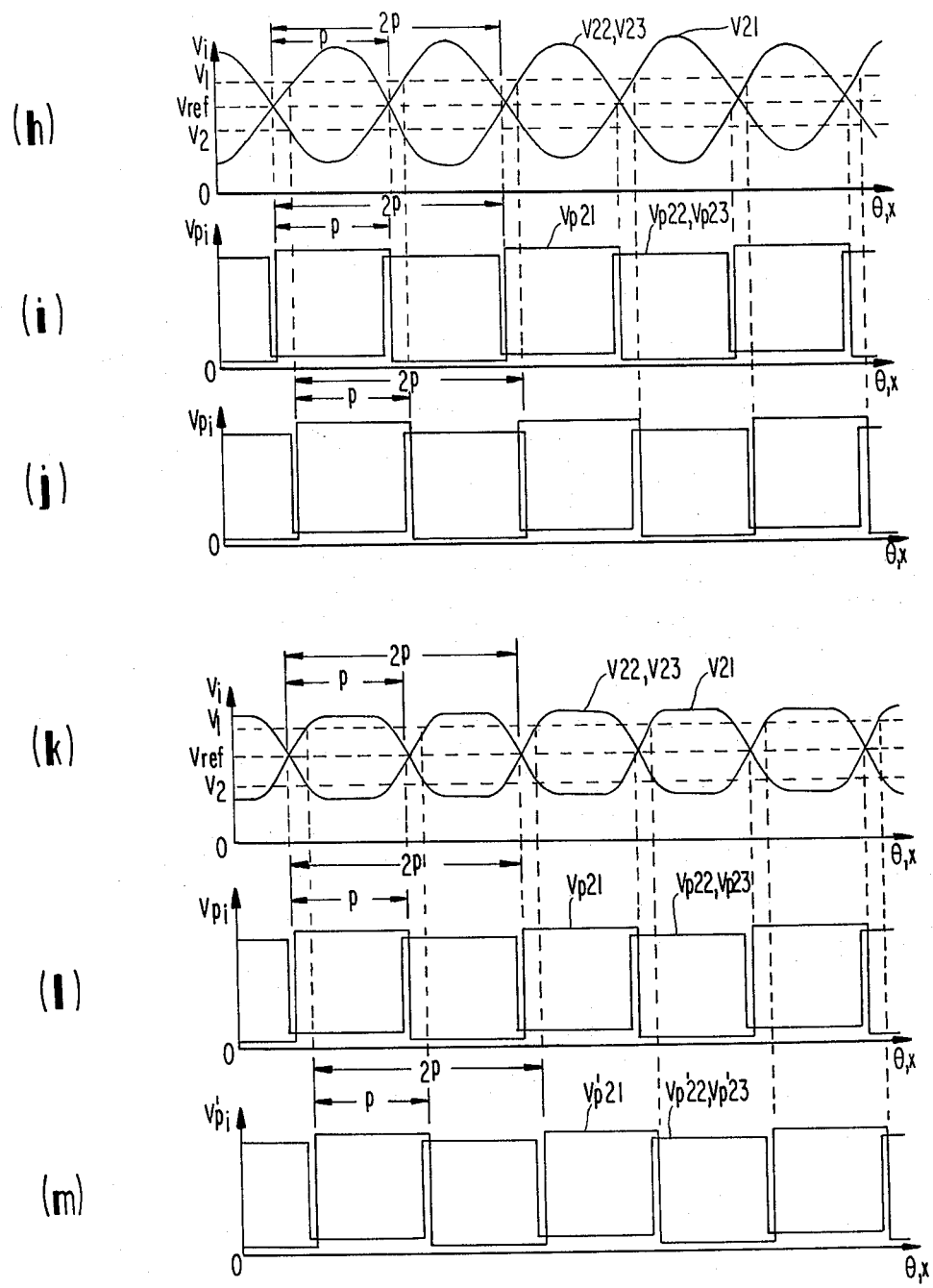
FIGS. 16(a) through 16(m) and FIGS. 17(a) through 17(i) are curves for explaining this invention.

As a result; $\Delta H >> \delta H$, so that the encoder unit 100 is practically free from malfunction. As is evident from FIGS. 11(a) and 11(d), the resistance changes between the MRs 21 and 23, and those between the MRs 22 and 24 are different by $\pi$ in phase, respectively. When the resistances of the MRs 21 and 23 and those of the MRs 22 and 24 become equal to each other, respectively, two independent pulses trains are obtained as shown in FIGS. 16(h) and (i) through the amplifier of FIG. 14b and the pulse generator of FIG. 15a. These pulse trains have a phase difference of $+\pi/2$ or $-\pi/2$.

The circuit of FIG. 18b detects the rotational direction of the means 13 based on whether the phase difference of the two pulse trains is positive or negative. The pulse counter 14-5 counts up or down the number of pulses from the pulse generator 14-2, and applies its counting result to the D/A converter 14-8 which in turn outputs an analog signal proportional to its input. Thus, the magnetic encoder unit 100 of FIG. 19 has two outputs, one of which indicates the rotational direction and is derived through the terminal T6 of FIG. 13, and the other indicating the incremental angular displacement and derived from the terminal T4 of FIG. 13.

As is evident from the foregoing, according to this invention, the MRs are arranged considering both the pitch and the width of the magnetic sections. Since the pitch and the width can be easily controlled, the present magnetic rotary encoder is inexpensive, easily assembled, highly resistive against external shocks, while maintaining accuracy and selectively using materials of the structural elements.

Angular resolution of the present encoder depends on the pitch of the magnetic sections as well as the configuration of the MRs. Especially, since the magnetic signals can be easily and accurately recorded on the medium 12 employing a known magnetic recording head practically in use in the art, the pitch can be accurately controlled with ease. This means that the angular resolution can be set to a desired range. Furthermore, the magnetic signals recorded can be easily erased if they are inadequately recorded. This feature makes it possible for the present encoder to supersede the conventional optical encoder. In addition, this invention also features that the same manufacturing method can be applied to a low resolution magnetic rotary encoder as well.

Since a plurality of MRs can be provided on a single support base through the same process, the magnetic field detector 18' is accurately manufactured at a comparatively low cost. It goes without saying, however, that a plurality of MRs can be alternatively mounted on more than one support base.

While this invention has been described in terms of specific illustrative embodiments, it is clear to those skilled in the art that many modifications can be conceived within the spirit and scope of the appended claims.

What is claimed is:

1. A magnetic rotary encoder comprising:
   a rotary means attachable to a rotatable shaft;
   a magnetic medium endlessly provided on a surface of said rotary means and divided at a pitch p into a plurality of magnetic sections each of which has a magnetic signal recorded thereon said magnetic medium having a thickness less than p and producing an alternating magnetic field as said rotary means revolves;
   a magnetic field detector including a magneto-resistor having a stripe-like configuration with width D and longitudinal dimension W and arranged in a plane substantially parallel to the nearest surface of said magnetic medium in the vicinity of said rotary means such as to be spaced relative to said magnetic medium by a spacing equal to or less than 20p at its furthest portion, said width D being so selected as not to be in excess of 20p at its furthest portion, said width D being so selected as not to be in excess of 20p but to be equal to or less than p.sec$\phi$, where $\phi$ is an angle defined by the nearest surfaces of said magneto-resistor and said magnetic medium, said magneto-resistor responsive to said alternating magnetic field and generating an analog signal representative of its electrical resistance change corresponding to the increment of the rotation angle of said rotary means, the boundary dividing each of said magnetic sections being within approximately 45° from parallel with respect to the direction of said longitudinal dimension of said magneto-resistor, said magnetic field detector further including high permeable magnetic means provided adjacent and substantially parallel to said magneto-resistor; and a rotary condition detector electrically connected to said magnetic field detector for receiving said analog signal and producing output signals indicative of the rotating conditions of said rotary means.

2. A magnetic rotary encoder comprising:

rotary means attachable to rotatable shaft;

a plurality of permanent magnets arranged on a surface of said rotary means so as to produce a magnetic field which changes in intensity and direction as said rotary means revolves:

a magnetic field detector including a magneto-resistor having a stripe-like configuration with width D and longitudinal dimension W and arranged in a plane substantially parallel to the nearest surface of said magnetic medium in the vicinity of said rotary means such as to be spaced relative to said permanent magnet by a spacing equal to or less than p at its nearest portion and by a spacing equal to or less than 20p at its furthest portion, said width D being so selected as not to be in excess of 20p but to be equal or less than $p.\sec\phi$, where $\phi$ is an angle defined by the nearest surface of said magneto-resistor and said permanent magnet, said magneto-resistor responsive to said alternating magnetic field and generating an analog signal representative of its electrical resistance change corresponding to the increment of the rotational angle of said rotary means, the boundary dividing each of said permanent magnets being within approximately 45° from parallel with respect to the direction of said longitudinal dimension of said magneto-resistor, said magnetic field detector further including high permeable magnetic means provided adjacent and substantially parallel to said magneto-resistor; and a rotary condition detector electrically connected to said magnetic field detector for receiving said analog signal and producing output signals indicative of the rotating conditions of said rotary means.

3. A magnetic rotary encoder as claimed in claim 2, wherein said permanent magnets are arranged contiguously and each of said permanent magnets has an opposite direction of magnetization with respect to its immediately adjacent magents.

4. A magnetic rotary encoder as claimed in claim 2, wherein said permanent magnets are regularly spaced by p and have the same direction of magnetization.

5. A magnetic rotary encoder as claimed in claims 1 or 2, wherein said magnetic field detector further includes means for slanting the magnetization of said magneto-resistor by an angle of 45 degrees relative to a sense current supplied from said rotary condition detector and flowing through said magneto-resistor.

6. A magnetic rotary encoder as claimed in claim 1, wherein said magnetic medium consists of magnetic fine particles bound on the surface of said rotary means for giving coercive force greater than 100 Oersted.

7. A magnetic rotary encoder as claimed in claims 1 or 2, wherein said rotary conditions are angular distance and/or angular velocity of said rotatable shaft.

8. A magnetic rotary encoder as claimed in claims 1 or 2, wherein said rotary condition detector generates a train of pulses each of which takes either a leading or trailing edge every time said magnetic rotary means moves an angular distance corresponding to p.

9. A magnetic rotary encoder as claimed in claims 1 or 2, wherein said rotary condition detector generates a train of pulses each of which has hysteresis.

10. A magnetic rotary encoder as claimed in claim 1, wherein said magnetic medium has coercive force greater than 100 Oersted.

11. A magnetic rotary encoder as claimed in claim 1, wherein said magnetic medium is a thin film of one of CO-P and CO-Ni-P alloy, providing a coercive force greater than 100 Oersted.

12. A magnetic rotary encoder as claimed in claim 2, wherein each said permanent magnets is made of one of barium ferrite and plastic rubber having barium ferrite fine particles dispersed therein.

13. A magnetic rotary encoder as claimed in claims 1 or 2, wherein said magneto-resistor is made of metal alloy including over 40 percent nickel.

14. A magnetic rotary encoder as claimed in claim 2, wherein each of said permanent magnets is made of a material consisting of at least one of Ni, Fe, Co, Al, and rare earth elements.

15. A magnetic rotary encoder as claimed in claim 1 or 2, wherein said magneto-resistor is made of a metal alloy including approximately 5% cobalt.

16. A magnetic rotary comprising:

rotary means attachable to a rotatable shaft;

a magnetic medium endlessly provided on a surface of said rotary means and divided at a pitch p into a plurality of magnetic sections each of which has a magnetic signal recorded thereon, said magnetic medium having a thickness less than p and producing an alternating magnetic field as said rotary means revolves;

a magnetic field detector including a plurality of magneto-resistors each having a stripe-like configuration with a width D, and longitudinal dimension W and arranged in a plane substantially parallel to the nearest surface of said magnetic medium in the vicinity of said rotary means such as to be spaced relative to said magnetic medium by a spacing equal to or less than p at its nearest portions and by a spacing equal to or less than 20p at its furthest portion, said width D being so selected as not to be in excess of 20p but to be equal to or less than p. $\sec\phi$, where $\phi$ is an angle defined by the nearest surfaces of one of said magneto-resistors and said magnetic medium, each of said magneto-resistors responsive to said alternating magnetic field and generating an analog signal representative of its electrical resistance change corresponding to the increment of the rotation angle of said rotary means, the boundary dividing each of said magnetic sections being within approximately 45° from parallel with respect to the direction of said longitudinal dimension of each of said magneto-resistors, said magnetic field detector further including high permeable magnetic means provided adjacent and substantially parallel to said magneto-resistor; and a rotary condition detector electrically connected to said magnetic field detector for receiving said analog signal and producing output signals indicative of rotating conditions of said rotary means.

17. A magnetic rotary encoder comprising:

rotary means attachable to a rotatable shaft;

a plurality of permanent magnets arranged on a surface of said rotary means so as to produce magnetic field which changes in intensity and direction as said rotary means revolves;

a magnetic field detector including a plurality of magneto-resistors each having a stripe-like configuration with a width D and longitudinal dimension W and arranged in a plane substantially parallel to the nearest surface of said magnetic medium in the vicinity of said rotary means such as to be spaced relative to said magnets by spacing equal to or less than p at its nearest portion and by a spacing equal to or less than 20p at its furthest portion, said width D being so selected as not to be in excess of 20p but to be equal to or less than p. sec$\phi$, where $\phi$ is an angle defined by the nearest surfaces of one of said magneto-resistors and said magnets, each of said magneto-resistors responsive to said alternating magnetic field and generating an analog signal representative of its electrical resistance change corresponding to be increment of the rotation angle of said rotary means, the boundary dividing each of said permanent magnets being within approximately 45° from parallel with respect to the direction of said longitudinal dimension of each of said magneto-resistors, said magnetic field detector further including high permeable magnetic means provided adjacent and substantially parallel to said magneto-resistor; and a rotary condition detector electrically connected to said magnetic field detector for receiving said analog signals and producing output signals indicative of the rotating conditions of said rotary means.

18. A magnetic rotary encoder as claimed in claim 17, wherein said permanent magnets are arranged contiguously and each of said permanent magnets has an opposite direction of magnetization with respect to its immediately adjacent magnets.

19. A magnetic rotary encoder as claimed in claim 17, wherein said permanent magnets are regularly spaced by p and having the same direction of magnetization with one another.

20. A magnetic rotary encoder as claimed in claims 16 or 17, wherein said magneto-resistors are regularly spaced by p or its integral multiple.

21. A magnetic rotary encoder as claimed in claims 16 or 17, wherein some of said magneto-resistors are spaced by $k.p + \Delta S$ (where k is a positive integer or zero and $\Delta S$ is a positive real number less than p) and the remaining magneto-resistors are spaced by $k'.p$ (where $k' = 1, 2, 3, 4, \ldots$) from each other.

22. A magnetic rotary encoder as claimed in claims 16 or 17, wherein the minimum of phase differences between said analog signals from said magneto-resistors is more than $\delta H$, where $\delta H$ is a phase deviation resulting from noises.

23. A magnetic rotary encoder as claimed in claims 16 or 17, wherein the minimum of spacings between adjacent magneto-resistors, $S_m$ satisfy:

$$S_m > \frac{\delta H}{2\pi} \cdot p.$$

where $\delta H$ is a phase deviation where $\delta H$ is a phase deviation resulting from noises.

24. A magnetic rotary encoder as claimed in claims 16 or 17, wherein the spacings between adjacent magneto-resistors satisfy the following:

$$S_{i,j} = \left| l \cdot \frac{p}{h} + k \cdot p \right|, h < \frac{2\pi}{\delta H}$$

where T is the number of magneto-resistors, h is the number of said analog signals differing in phase, each of the suffixes i and j is a positive integer ranging form 1 to T, $S_{i,j}$ indicates that a spacing between i-th and j-th magnetoresistors, l and k are integers and $\delta H$ is a phase deviation resulting from noises.

25. A magnetic rotary encoder as claimed in claims 16 or 17, wherein said magnetic field detector further includes means for slanting the magnetization of each said magneto-resistors by an angle of 45 degrees relative to a sense current supplied from said rotary condition detector and flowing through said magneto-resistors.

26. A megnetic rotary encoder as claimed in claims 16 or 17, wherein said rotary conditions are angular distance, angular velocity, and the direction of rotation of said rotatable shaft.

27. A magnetic rotary encoder as claimed in claims 16 or 17, wherein said rotary condition detector generates a train of pulses each of which takes either a leading or trailing edge every time said magnetic rotary means moves an angular distance corresponding to p.

28. A magnetic rotary encoder as claimed in claims 16 or 17, wherein said rotary condition detector generates a train of pulses having hysteresis.

29. A magnetic rotary encoder as claimed in claims 16 or 17, wherein said rotary condition detector produces at least two pulse trains wherein each of the pulses takes either a leading or trailing edge every time two of the analog signals different in phase take the same value simultaneously.

30. A magnetic rotary encoder as claimed in claims 16 or 17, wherein said rotary condition detector produces at least two pulse trains wherein each of the pulses takes either a leading or trailing edge every time two of the analog signals different in phase take a predetermined phase difference.

31. A magnetic rotary encoder as claimed in claims 16 or 17, wherein, with T standing for the number of said magneto-resistors and h for the number of said analog signals different in phase, said rotary condition detector produces h(h-1) pulse trains at maximum each of which is different in phase, wherein $2 \leq h \leq T$ and each of the pulses takes either a leading or trailing edge every time two of the analog signals different in phase take the same value simultaneously.

32. A magnetic rotary encoder as claimed in claims 16 or 17, wherein, with h standing for the number of said analog signals different in phase and $m(\leq h(h-1))$ for the number of the pulse trains appearing during the angular distance corresponding to p, said rotary condition detector produces pulse trains, wherein its minimum angular determining unit is defined by p/(R.m): R standing for an inner radius of said rotary means.

33. A magnetic rotary encoder as claimed in claims 16 or 17, wherein said rotary condition detector detects said rotating direction based on whether the phase difference between two analog signals is positive or negative.

34. A magnetic rotary encoder as claimed in claim 16, wherein said magnetic medium has coercive force more than 100 Oersted.

35. A magnetic rotary encoder as claimed in claim 16, wherein said magnetic medium is a thin film of one of Co-p and Co-Ni-P alloy and having coercive force more than 100 Oersted.

36. A magnetic rotary encoder as claimed in claim 17, wherein each said permanent magnets is made of one of barium ferrite and plastic rubber having barium ferrite fine particles dispersed therein.

37. A magnetic rotary encoder as claimed in claims 16 or 17, wherein said magneto-resistor is made of metal alloy including over 40% nickel of nickel.

38. A magnetic rotary encoder as claimed in claims 16 or 17, wherein said plurality of magneto-resistors are arranged on one substrate.

39. A magnetic rotary encoder as claimed in claims 16 or 17, wherein said plurality of magneto-resistors are arranged on more than one substrate.

40. A magnetic rotary encoder as claimed in claim 16, wherein said magnetic medium is comprised of magnetic fine particles bound on the surface of said rotary means, and having coercive force of more than 100 Oersted.

41. A magnetic rotary encoder as claimed in claim 17, wherein each of said permanent magnets is comprises of a material consisting mainly of at least one of Ni, Fe, Co, Al, and rare earth elements.

42. A magnetic rotary encoder as claimed in claim 16 or 16, wherein said magneto-resistor is made of a metal alloy including approximately 5% of cobalt.

43. A magnetic rotary encoder comprising:
rotary means attachable to a rotatable shaft;
a magnetic medium endlessly provided on a surface of said rotary means and divided at a pitch p into a plurality of magnetic sections each of which as a magnetic signal recorded thereon said magnetic medium having a thickness less than p and producing an alternating magnetic field as said rotary means revolves;
a magnetic field detector including a magneto-resistor having a stripe-like configuration with width D and longitudinal dimension W and arranged in the vicinity of said rotary means such as to be spaced relative to said magnetic medium by a spacing equal to or less than 20p at its furthest portion said width D being so selected as not to be in excess of 20p but to be equal to or less than p.sec$\phi$, where $\phi$ is an angle defined by the nearest surfaces of said magneto-resistor and said magnetic medium, said magneto-resistor responsive to said alternating magnetic field and generating an analog signal representative of its electrical resistance change corresponding to the increment to the rotation angle of said rotatary means, and the boundary dividing each of said magnetic sections being within approximately 45° from parallel with respect to the direction of said longitudinal dimension of said magneto-resistor; and
a rotary condition detector electrically connected to said magnetic field detector for receiving said analog signal and producing output signals indicative of the rotating conditions of said rotary means; wherein said magnetic field detector further includes means for slanting the magnetization of said magneto-resistor by an angle of 45° relative to a sense current supplied from said rotary condition detector and flowing through said magneto-resistor.

44. A magnetic rotary encoder comprising:
rotary means attachable to rotatable shaft;
a plurality of permanent magnets arranged on a surface of said rotary means so as to produce a magnetic field which changes in intensity and direction as said rotary means revolves;
a magnetic field detector including a magneto-resistor having a stripe-like configuration with width D and longitudinal dimension W and arranged in the vicinity of said rotary means such as to be spaced relative to said permanent magnetic by a spacing equal to or less than p at its nearest portion and by a spacing equal to or less than 20 p at its furthest portion, said width D being so selected as not to be in excess of 20 p but to be equal or less than p.sec$\phi$, where $\phi$ is an angle defined by the nearest surface of said magneto-resistor and said permanent magnet, said magneto-resistor responsive to said alternating magnetic field and generating an analog signal representative of its electrical resistance change corresponding to the increment of the rotational angle of said rotary means, and the boundary dividing each of said permanent magnets being within approximately 45° from parallel with respect to the direction of said longitudinal dimension of said magneto-resistor; and
a rotary condition detector electrically connected to said magnetic field detector for receiving said analog signal and producing output signals indicative of the rotating conditions of said rotary means; wherein said magnetic field detector further includes means for slanting the magnetization of said magneto-resistor by an angle of 45° relative to a sense current supplied from said rotary condition detector and flowing through said magneto-resistor.

45. A magnetic rotary comprising:
rotary means attachable to a rotatable shaft;
a magnetic medium endlessly provided on a surface of said rotary means and divided at a pitch p into a plurality of magnetic sections each of which has a magnetic signal recorded thereon, said magnetic medium having a thickness less than p and producing an alternating magnetic field as said rotary means revolves;
a magnetic field detector including a plurality of magneto-resistors each having a stripe-like configuration with a width D, and longitudinal dimension W and arranged in the vicinity of said rotary means such as to be spaced relative to said magnetic medium by a spacing equal to or less than p at its nearest portion and by a spacing equal to or less than 20 p at its furthest portion, said width D being so selected as not to be in excess of 20 p but to be equal to or less than p. sec$\phi$, where $\phi$ is an angle defined by the nearest surfaces of one of said magneto-resistors and said magnetic medium, each of said magneto-resistors responsive to said alternating magnetic field and generating an analog signal representative of its electrical resistance change corresponding to the increment of the rotation angle of said rotary means, and the boundary dividing each of said magnetic sections being within approximately 45° from parallel with respect to the direction of said longitudinal dimension of each of said magneto-resistors; and
a rotary condition detector electrically connected to said magnetic field detector for receiving said analog signal and producing output signals indicative of rotating conditions of said rotary means;

wherein the minimum of spacings between adjacent magneto-resistors, $S_m$ satisfy:

$$S_m > \frac{\delta H}{2\pi} \cdot p,$$

where $\delta H$ is a phase deviation where $\delta H$ is a phase deviation resulting from noises.

46. A magnetic rotary encoder comprising:
rotary means attachable to a rotatable shaft;
a plurality of permanent magnets arranged on a surface of said rotary means so as to produce magnetic field which changes in intensity and direction as said rotary means revolves;
a magnetic field detector including a plurality of magneto-resistors each having a stripe-like configuration with a width D and longitudinal dimension W and arranged in the vicinity of said rotary means such as to be spaced relative to said magnets by spacing equal to or less than p at its nearest portion and by a spacing equal to or less than 20 p at its furthest portion, said width D being so selected as not to be in excess of 20 p but to be equal to or less than p. $\sec\phi$, where $\phi$ is an angle defined by the nearest surfaces of one of said magneto-resistors and said magnets, each of said magneto-resistors responsive to said alternating magnetic field and generating an analog signal representative of its electrical resistance change corresponding to the increment of the rotation angle of said rotary means, and the boundary dividing each of said permanent magnets being within approximately 45° from parallel with respect to the direction of said longitudinal dimension of each of said magneto-resistors; and
a rotary condition detector electrically connected to said magnetic field detector for receiving said analog signals and producing output signals indicative of the rotating conditions of said rotary means; wherein the minimum of spacings between adjacent magneto-resistors, $S_m$ satisfy:

$$S_m > \frac{\delta H}{2\pi} \cdot p,$$

where $\delta H$ is a phase deviation where $\delta H$ is a phase deviation resulting from noises.

47. A magnetic rotary comprising:
rotary means attachable to a rotatable shaft;
a magnetic medium endlessly provided on a surface of said rotary means and divided at a pitch p into a plurality of magnetic sections each of which has a magnetic signal recorded thereon, said magnetic medium having a thickness less than p and producing an alternating magnetic field as said rotary means revolves;
a magnetic field detector including a plurality of magneto-resistors each having a stripe-like configuration with a width D, and longitudinal dimension W and arranged in the vicinity of said rotary means such as to be spaced relative to said magnetic medium by a spacing equal to or less than p at its nearest portion and by a spacing equal to or less than 20 p at its furthest portion, said width D being so selected as not to be in excess of 20 p but to be equal to or less than p. $\sec\phi$, where $\phi$ is an angle defined by the nearest surfaces of one of said magneto-resistors and said magnetic medium, each of said magneto-resistors responsive to said alternating magnetic field and generating an analog signal representative of its electrical resistance change corresponding to the increment of the rotation angle of said rotary means, and the boundary dividing each of said magnetic sections being within approximately 45° from parallel with respect to the direction of said longitudinal dimension of each of said magneto-resistors; and
a rotary condition detector electrically connected to said magnetic field detector for receiving said analog signal and producing output signals indicative of rotating conditions of said rotary means; wherein the spacings between adjacent magneto-resistors satisfy the following:

$$S_{i,j} = \left| l \cdot \frac{p}{h} + k \cdot p \right|, h < \frac{2\pi}{\delta H}$$

where T is the number of magneto-resistors, h is the number of said analog signals differing in phase, each of the suffixes i and j is a positive integer ranging from 1 to T, $S_{i,j}$ indicates a spacing between i-th and j-th magneto-resistors, l and k are integers and $\delta H$ is a phase deviation resulting from noises.

48. A magnetic rotary encoder comprising:
rotary means attachable to a rotatable shaft;
a plurality of permanent magnets arranged on a surface of said rotary means so as to produce magnetic field which changes in intensity and direction as said rotary means revolves;
a magnetic field detector including a plurality of magneto-resistors each having a stripe-like configuration with a width D and longitudinal dimension W and arranged in the vicinity of said rotary means such as to be spaced relative to said magnets by spacing equal to or less than p at its nearest portion and by a spacing equal to or less than 20 p at its furthest portion, said width D being so selected as not to be in excess of 20 p but to be equal to or less than p. $\sec\phi$, where $\phi$ is an angle defined by the nearest surfaces of one of said magneto-resistors and said magnets, each of said magneto-resistors responsive to said alternating magnetic field and generating an analog signal representative of its electrical resistance change corresponding to the increment of the rotation angle of said rotary means, and the boundary dividing each of said permanent magnets being within approximately 45° from parallel with respect to the direction of said longitudinal dimension of each of said magneto-resistors; and
a rotary condition detector electrically connected to said magnetic field detector for receiving said analog signals and producing output signals indicative of the rotating conditions of said rotary means; wherein the spacings between adjacent magento-resistors satisfy the following:

$$S_{i,j} = \left| l \cdot \frac{p}{h} + k \cdot p \right|, h < \frac{2\pi}{\delta H}$$

where T is the number of magneto-resistors, h is the number of said analog signals differing in phase, each of the suffixes i and j is a positive integer ranging from 1 to T, $S_{i,j}$ indicates a spacing between i-th and j-th magnetoresistors, l and k are integers and δH is a phase deviation resulting from noises.

49. A magnetic rotary comprising:
rotary means attachable to a rotatable shaft;
a magnetic medium endlessly provided on a surface of said rotary means and divided at a pitch p into a plurality of magnetic sections each of which has a magnetic signal recorded thereon, said magnetic medium having a thickness less than p and producing an alternating magnetic field as said rotary means revolves;
a magnetic field detector including a plurality of magneto-resistors each having a stripe-like configuration with a width D, and longitudinal dimension W and arranged in the vicinity of said rotary means such as to be spaced relative to said magnetic medium by a spacing equal to or less than p at its nearest portion and by a spacing equal to or less than 20 p at its furthest portion, said width D being so selected as not to be in excess of 20 p but to be equal to or less than p. sec$\phi$, where $\phi$ is an angle defined by the nearest surfaces of one of said magneto-resistors and said magnetic medium, each of said magneto-resistors responsive to said alternating magnetic field and generating an analog signal representative of its electrical resistance change corresponding to the increment of the rotation angle of said rotary means, and the boundary dividing each of said magnetic sections being within approximately 45° from parallel with respect to the direction of said longitudinal dimension of each of said magneto-resistors; and
a rotary condition detector electrically connected to said magnetic field detector for receiving said analog signal and producing output signals indicative of rotating conditions of said rotary means; wherein said magnetic field detector further includes means for slanting the magnetization of each said magneto-resistors by an angle of 45° relative to a sense current supplied from said rotary condition detector and flowing through said magneto-resistor.

50. A magnetic rotary encoder comprising:
rotary means attachable to a rotatable shaft;
a plurality of permanent magnets arranged on a surface of said rotary means so as to produce magnetic field which changes in intensity and direction as said rotary means revolves;
a magnetic field detector including a plurality of magneto-resistors each having a stripe-like configuration with a width D and longitudinal dimension W and arranged in the vicinity of said rotary means such as to be spaced relative to said magnets by spacing equal to or less than p at its nearest portion and by a spacing equal to or less than 20 p at its furthest portion, said width D being so selected as not to be in excess of 20 p but to be equal to or less than p. sec$\phi$, where $\phi$ is an angle defined by the nearest surfaces of one of said magneto-resistors and said magnets, each of said magneto-resistors responsive to said alternating magnetic field and generating an analog signal representative of its electrical resistance change corresponding to the increment of the rotation angle of said rotary means, and the boundary dividing each of said permanent magnets being within approximately 45° from parallel with respect to the direction of said longitudinal dimension of each of said magneto-resistors; and
a rotary condition detector electrically connected to said magnetic field detector for receiving said analog signals and producing output signals indicative of the rotating conditions of said rotary means; wherein said magnetic field detector further includes means for slanting the magnetization of each of said magneto-resistors by an angle of 45° relative to a sense current supplied from said rotary condition detector and flowing through said magneto-resistor.

51. A magnetic rotary comprising:
rotary means attachable to a rotatable shaft;
a magnetic medium endlessly provided on a surface of said rotary means and divided at a pitch p into a plurality of magnetic sections each of which has a magnetic signal recorded thereon, said magnetic medium having a thickness less than p and producing an alternating magnetic field as said rotary means revolves;
a magnetic field detector including a plurality of magneto-resistors each having a stripe-like configuration with a width D, and longitudinal dimension W and arranged in the vicinity of said rotary means such as to be spaced relative to said magnetic medium by a spacing equal to or less than p at its nearest portion and by a spacing equal to or less than 20 p at its furthest portion, said width D being so selected as not to be in excess of 20 p but to be equal to or less than p. sec$\phi$, where $\phi$ is an angle defined by the nearest surfaces of one of said magneto-resistors and said magnetic medium, each of said magneto-resistors responsive to said alternating magnetic field and generating an analog signal representative of its electrical resistance change corresponding to the increment of the rotation angle of said rotary means, and the boundary dividing each of said magnetic sections being within approximately 45° from parallel with respect to the direction of said longitudinal dimension of each of said magneto-resistors; and
a rotary condition detector electrically connected to said magnetic field detector for receiving said analog signal and producing output signals indicative of rotating conditions of said rotary means; wherein with T standing for the number of said magneto-resistors and h for the number of said analog signals different in phase, said rotary condition detector produces h(h-1) pulse trains at maximum each of which is different in phase, wherein $2 \leq h \leq T$ and each of the pulses takes either a leading or trailing edge every time two of the analog signals different in phase take the same value simultaneously.

52. A magnetic rotary encoder comprising:
rotary means attachable to a rotatable shaft;
a plurality of permanent magnets arranged on a surface of said rotary means so as to produce magnetic field which changes in intensity and direction as said rotary means revolves;
a magnetic field detector including a plurality of magneto-resistors each having a stripe-like configuration with a width D and longitudinal dimension W and arranged in the vicinity of said rotary means such as to be spaced relative to said magnets by spacing equal to or less than p at its nearest portion and by a spacing equal to or less than 20 p at its furthest portion, said width D being so selected as not to be in excess of 20 p but to be equal to or less than p. sec$\phi$, where $\phi$ is an angle defined by the nearest surfaces of one of said magneto-resistors and said magnets, each of said magneto-resistors responsive to said alternating magnetic field and generating an analog signal representative of its electrical resistance change corresponding to the increment of the rotation angle of said rotary means, and the boundary dividing each of said permanent magnets being within approximately 45° from parallel with respect to the direction of said longitudinal dimension of each of said magneto-resistors; and a rotary condition detector electrically connected to said magnetic field detector for receiving said analog signals and producing output signals indicative of the rotating conditions of said rotary means; wherein with T standing for the number of said magneto-resistors and h for the number of said analog signals different in phase, said rotary condition detector produces h(h-1) pulse trains at maximum each of which is different in phase, wherein 2≦h≦T and each of the pulses takes either a leading or trailing edge every time two of the analog signals different in phase take the same value simultaneously.

53. A magnetic rotary encoder having a magnetic rotary encoder unit and a housing member for containing said encoder unit wherein said magnetic rotary encoder unit comprises:

rotary means attachable to a rotatable shaft;

a magnetic medium endlessly provided on a surface of said rotary means and divided at a pitch p into a plurality of magnetic sections each of which has a magnetic signal recorded thereon, said magnetic medium having a thickness less than p producing an alternating magnetic field as said rotary means revolves;

a magnetic field detector including at least one magneto-resistor having a stripe-like configuration with a width D and longitudinal dimension W and arranged in a plane substantially parallel to the nearest surface of said magnetic medium in the vicinity of said rotary means such as to be spaced relative to said magnetic medium by a spacing equal to or less than p at its nearest portion and by a spacing equal to or less than 20 p at its furthest portion, said width D being so selected as not to be in excess of 20 p but to be equal to or less than p. sec$\phi$, where $\phi$ is an angle defined by the nearest surfaces of said magneto-resistor and said magnetic medium, and said magneto-resistor responsive to said alternating magnetic field and generating an analog signal representative of its electrical resistor change corresponding to the increment of the rotational angle of said rotary means, the boundary dividing each of said magnetic sections being within approximately 45° from parallel with respect to the direction of said longitudinal dimension of said at least one magneto-resistor, said magnetic field detector further including high permeable magnetic means provided adjacent and substantially parallel to said magneto-resistor; and a rotary condition detector electrically connected to said magnetic field detector for receiving said analog signal and producing signals indicative of the rotating conditions of said rotary means, and wherein said housing member has means for magnetically shielding itself from external magnetic fields.

54. A magnetic rotary encoder having a magnetic rotary encoder unit and a housing member for containing said encoder unit wherein said encoder unit comprises:

rotary means attachable to rotatable shaft;

a plurality of permanent magnets arranged on a surface of said rotary means so as to produce a magnetic field which changes in intensity and direction as said rotary means revolves;

a magnetic field detector including at least one magneto-resistor having a stripe-like configuration with width D and longitudinal dimension W and arranged in a plane substantially parallel to the nearest surface of said magnetic medium in the vicinity of said rotary means such as to be spaced relative to said permanent magnet by a spacing equal to or less than p at its nearest portion and by a spacing equal to or less than 20 p at its furthest portion, said width D being so selected as not to be in excess of 20 p but to be equal or less than p. sec$\phi$, where $\phi$ is an angle defined by the nearest surfaces of said magneto-resistor and said permanent magnets, said magneto-resistor responsive to said alternating magnetic field and generating an analog signal representative of its electrical resistance change corresponding to the increment of the rotational angle of said rotary means, the boundary dividing each of said permanent magnets being within approximately 45° from parallel with respect to the direction of said longitudinal dimension of said at least one magneto-resistor, said magnetic field detector further including high permeable magnetic means provided adjacent and substantially parallel to said magneto-resistor; and a rotary condition detector electrically connected to said magnet field detector for receiving said analog signal and producing signals indicative of the rotating conditions of said rotary means, and wherein said housing member has means for magnetically shielding itself from external magnetic fields.

* * * * *

UNITED STATES PATENT AND TRADEMARK OFFICE
CERTIFICATE OF CORRECTION

PATENT NO. : 4,319,188
DATED : March 9, 1982
INVENTOR(S) : Susumu ITO et al.

It is certified that error appears in the above—identified patent and that said Letters Patent is hereby corrected as shown below: On the title page Abstract, line 12, delete "of" and insert -- as -- .

Column 1, line 62, after "shocks" insert -- and -- .

Column 5, line 40, change the formula to read --

$$R(\phi) = R_0 - \Delta R \sin^2 \phi$$ --

Column 6, line 29, delete "is" and insert -- to -- ;

Column 7, line 28, delete "MR2Q" and insert -- MR20 -- ;

line 29, delete "20" and insert -- 2Q -- .

Column 8, line 56, delete "j" and insert -- a -- .

Column 13, line 18, delete "determination" and insert -- determining -- .

Column 14, line 49, delete "resistors" and insert -- resistive -- .

Column 17, line 47, delete "magents" and insert -- magnets -- .

Column 18, line 9, delete "CO-P and CO-Ni-P" and insert -- Co-P and Co-Ni-P -- .

Column 20, line 18, delete "megnetic" and insert -- magnetic -- .

UNITED STATES PATENT AND TRADEMARK OFFICE
CERTIFICATE OF CORRECTION

PATENT NO. : 4,319,188

DATED : March 9, 1982

INVENTOR(S) : Susumu ITO et al.

It is certified that error appears in the above—identified patent and that said Letters Patent is hereby corrected as shown below:

Column 21, line 1, delete "Co-p" and insert -- Co-P -- ;

line 9, delete "of nickel" ;

line 22, delete "comprises" and insert -- comprised -- ;

line 26, delete "16" and insert -- 17 -- ;

line 33, delete "as" and insert -- has -- ;

line 51, delete "to" (second occurrence) and insert -- of -- ;

line 52, delete "rotatary" and insert -- rotary -- .

UNITED STATES PATENT AND TRADEMARK OFFICE
CERTIFICATE OF CORRECTION

PATENT NO. : 4,319,188

DATED : March 9, 1982

INVENTOR(S) : Susumu ITO et al.

It is certified that error appears in the above—identified patent and that said Letters Patent is hereby corrected as shown below:

Column 22, line 9, delete "magnetic" and insert -- magnet -- .

Column 24, line 58, delete "magento" and insert -- magneto -- .

Signed and Sealed this

Sixth Day of July 1982

[SEAL]

Attest:

Attesting Officer

GERALD J. MOSSINGHOFF

Commissioner of Patents and Trademarks